United States Patent
Hurwicz

(10) Patent No.: US 7,173,428 B2
(45) Date of Patent: Feb. 6, 2007

(54) PORTABLE CIRCUIT INTERRUPTER SHUTOFF TESTING DEVICE AND METHOD

(76) Inventor: Maxim D. Hurwicz, 224 N. 4th St., Stillwater, MN (US) 55082

( * ) Notice: Subject to any disclaimer, the term of this patent is extended or adjusted under 35 U.S.C. 154(b) by 144 days.

(21) Appl. No.: 10/293,524

(22) Filed: Nov. 12, 2002

(65) Prior Publication Data

US 2003/0090271 A1 May 15, 2003

Related U.S. Application Data

(60) Provisional application No. 60/337,650, filed on Nov. 13, 2001.

(51) Int. Cl.
*G01R 31/327* (2006.01)
*G01R 31/12* (2006.01)

(52) U.S. Cl. .................. 324/424; 324/536

(58) Field of Classification Search .......... 324/424, 324/536, 555; 361/42, 43; 393/424
See application file for complete search history.

(56) References Cited

U.S. PATENT DOCUMENTS

| | | | | |
|---|---|---|---|---|
| 3,678,372 A | * | 7/1972 | Elder | 323/342 |
| 3,742,304 A | * | 6/1973 | Elder | 361/198 |
| 3,852,660 A | * | 12/1974 | Maier et al. | 324/424 |
| 3,924,160 A | * | 12/1975 | Maier et al. | 361/94 |
| 4,105,965 A | * | 8/1978 | Russell | 324/424 |
| 4,634,981 A | | 1/1987 | Shimp et al. | |
| 5,642,052 A | * | 6/1997 | Earle | 324/556 |
| 5,650,907 A | * | 7/1997 | Ishii et al. | 361/93.4 |
| 5,812,352 A | * | 9/1998 | Rokita et al. | 361/58 |
| 5,982,593 A | * | 11/1999 | Kimblin et al. | 361/42 |
| 6,072,317 A | * | 6/2000 | Mackenzie | 324/536 |
| 6,259,340 B1 | * | 7/2001 | Fuhr et al. | 335/18 |
| 6,362,628 B2 | * | 3/2002 | Macbeth et al. | 324/536 |
| 6,515,564 B2 | | 2/2003 | Leopold et al. | |
| 6,525,541 B1 | | 2/2003 | Leopold | |
| 6,532,139 B2 | | 3/2003 | Kim et al. | |
| 6,532,140 B1 | | 3/2003 | McMahon et al. | |
| 6,532,424 B1 | | 3/2003 | Haun et al. | |
| 6,534,991 B2 | | 3/2003 | Marple et al. | |

(Continued)

FOREIGN PATENT DOCUMENTS

ZA   9407556 A   *   7/1995

(Continued)

*Primary Examiner*—Diane Lee
*Assistant Examiner*—John Teresinski
(74) *Attorney, Agent, or Firm*—Charles A. Lemaire; Lemaire Patent Law Firm, P.L.L.C.

(57) ABSTRACT

A portable circuit interrupter shutoff testing device and method, including a high current switch controlled by a timing circuit that allows current to flow through the switch and a small series resistance (in order to trip the instantaneous-trip function of the interrupter, as opposed to the overload-trip) for a short time period relative to the sine wave of the electrical power. A button activates the timing circuit which in turn activates the switch and current flows limited by the internal resistor of the device. By limiting the on time of the device to one of a few half cycles, the user can test if the circuit interrupter responds as quickly as specified by the manufacturer. A method includes receiving a stimulation indication, and selectively connecting an electrical load is sufficient to trigger the instantaneous-trip function of the circuit-interrupter.

68 Claims, 14 Drawing Sheets

U.S. PATENT DOCUMENTS

| | | |
|---|---|---|
| 6,538,862 B1 | 3/2003 | Mason, Jr. et al. |
| 6,545,479 B1 * | 4/2003 | Dollar et al. ............... 324/424 |
| 6,590,754 B1 | 7/2003 | Macbeth |
| 6,600,669 B2 | 7/2003 | Trzynadlowski et al. |
| 6,618,649 B1 | 9/2003 | Shilo |
| 6,657,837 B1 | 12/2003 | Morris et al. |
| 6,717,786 B2 | 4/2004 | Holley et al. |
| 6,718,513 B1 | 4/2004 | Ryu |
| 6,720,872 B1 | 4/2004 | Engel et al. |
| 6,728,085 B2 | 4/2004 | Dudhwala et al. |
| 6,731,483 B2 | 5/2004 | Mason, Jr. et al. |
| 6,744,254 B2 | 6/2004 | Clarey et al. |
| 6,744,260 B2 | 6/2004 | Schmalz et al. |

FOREIGN PATENT DOCUMENTS

| | | | |
|---|---|---|---|
| ZA | 9507352 A | * | 3/1996 |

* cited by examiner

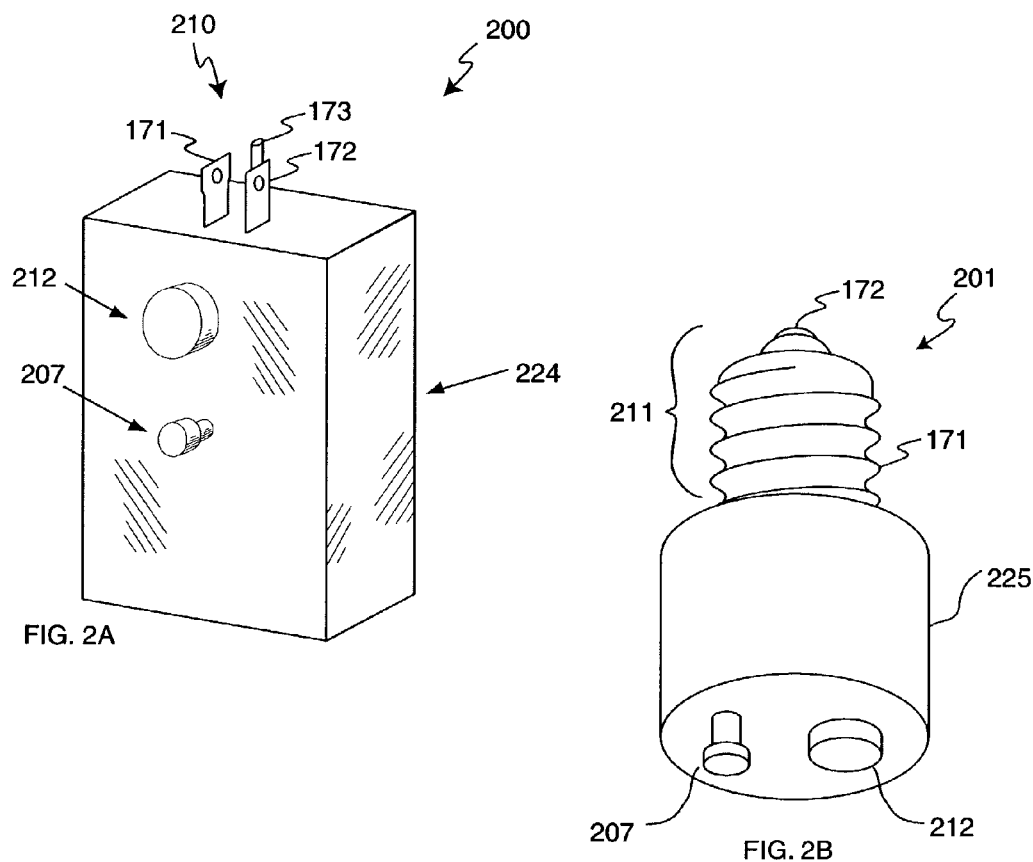
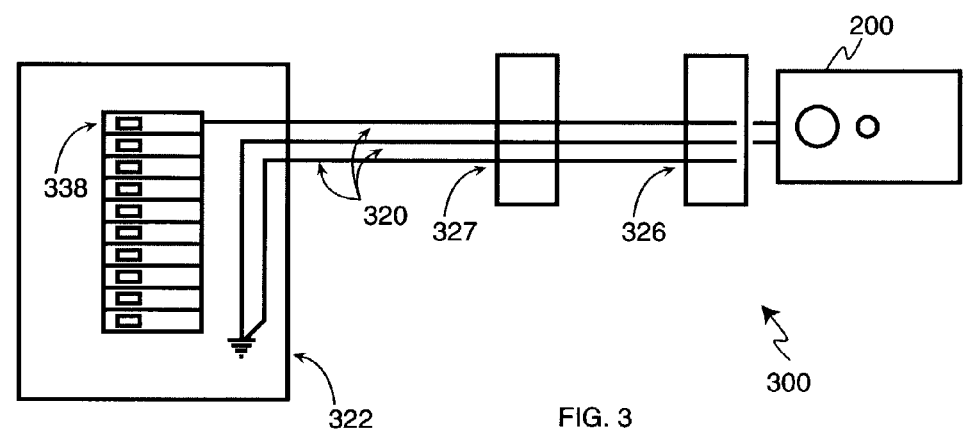

PORTABLE CIRCUIT INTERRUPTER SHUTOFF TESTING DEVICE AND METHOD

I hereby claim the benefit under 35 U.S.C. § 119(e) of U.S. Provisional Application 60/337,650 filed Nov. 13, 2001, which is hereby incorporated in its entirety by reference.

BACKGROUND—THE FIELD OF THE INVENTION

This invention relates to electrical circuitry testers, including circuit-interrupter testers. More particularly, it relates to the method and apparatus for testing and breaking instantaneous circuit interrupters in electrical boxes and outlets.

BACKGROUND

Instantaneous circuit interrupters (also called instantaneous circuit breakers) and overload circuit interrupters (also called overload circuit breakers) are important components used to protect electrical circuits. Often, an instantaneous circuit interrupter and an overload circuit interrupter are packaged in a single device simply called a circuit breaker. Typically, a plurality of such combination-circuit-breaker devices are installed in a "breaker box" or "panel" used to protect a corresponding number of electrical circuits in a house or building.

Instantaneous circuit interrupters supply a means of interrupting current that might be dangerous to people or the wiring circuit, as in the case of a short-circuit overcurrent that could result in a fire or electrocution. An instantaneous circuit interrupter typically employs an electromagnet switch to open immediately (with no intentional time delay) when a high multiple of the rated current is sensed. On the other hand, an overload circuit interrupter typically employs a bimetal strip switch to open after a slight delay (with an intentional time delay that is inversely proportional to the amount of overcurrent) when a low multiple of the rated current is sensed. A third type of circuit protection interrupter, called a GFCI (Ground Fault Current Interrupter, also known as GFI) interrupt current being drained off a circuit to ground that could present a shock hazard to people. Often a combination of an instantaneous circuit interrupter, an overload circuit interrupter device and a GFCI device are incorporated serially in the same circuit or combined into a single unit.

There are three basic situations where circuit interrupters come into play and open the circuit. First when there is a short circuit causing a sudden very high surge of current. This should trip the instantaneous circuit interrupter. Second when there is an ongoing load that draws more current than the interrupter is rated for. This should trip the overload circuit interrupter. Third, when there is some current being drawn off to ground. This should trip the GFCI.

In each of these situations there are very definite specifications as to how long the interrupter has to respond. It is essential that these devices operate within these parameters, either to open quickly as in a short circuit or an improper ground, or relatively slowly as in the case of a smaller overload. For instance in the latter situation where, when a motor is starting up, the motor may draw a much higher current for a short period of time. It would be inconvenient to have the breaker tripping at these times. Thus, circuit breakers have an overload circuit interrupter employing a thermal element that allows small overcurrents for limited time periods. But in the case of a short circuit or a ground fault it is essential that the breaker interrupt the current flow as quickly as possible, generally within a few cycles of AC power.

Each of these sensing capabilities can function independently of each other. For instance, a short circuit can trip a circuit breaker (i.e., the instantaneous circuit interrupter) in a panel while the GFCI upstream of it is unaffected. Similarly, an extended overcurrent can cause the thermal portion of a circuit breaker to unlatch while the GFCI remains unaffected. Finally, a GFCI can trip while the circuit breaker downstream remains in the closed position. The capability of tripping as quickly as possible is called the instantaneous tripping response.

Conventional circuit breaker testing devices suffer by only testing either circuit breakers or GFIs. Ideally one device should be able to test either selectively and separately.

Devices heretofore known suffer from one or more of the following disadvantages:

(a) the circuit breaker is not predictably tripped;

(b) a part of the device is consumed in use, as with an internal fuse blowing;

(c) requiring the user to travel back and forth between the circuit breaker panel and the point in the circuit where one wishes to work;

(d) switching off and on of multiple circuit breakers, which will affect appliances on those circuits;

(e) requiring two devices, a transmitter and a receiver;

(f) removal of the breaker from the panel;

(g) does not switch off the breaker from the location where one wishes to work;

(h) tests and trips a GFI device but not the circuit breaker protecting that GFI device;

(i) tests the thermal sensor of the circuit interrupter as opposed to the instantaneous magnetic tripping capability of the interrupter;

(j) overstresses the circuit by drawing more wattage (volts times amps) or power (volts times amps times time) than actually required for such a test;

(k) cannot be used at any point in the circuit of the circuit breaker;

(l) potential damage to wiring and the device in the event of the circuit breaker not tripping off;

(m) excessive heat being dissipated during the time it normally takes the breaker to trip;

(n) damage to switch contacts due to arcing;

(o) tests either only a circuit breaker or a GFCI, but not either selectively (this means two separate devices are required instead of one);

(p) does not test if the circuit interrupter is operating within prescribed specifications, but only if it functions at all;

(q) does not incorporate an interrupter within the device that will respond to various dangerous situations such as the device's switch fusing closed while there is a load of sufficient magnitude to present an overheating condition in the wiring of the circuit or in the device itself;

(r) incorporates an interrupter within the device that may blow during normal operation of the device's testing procedure;

(s) incorporates an interrupter within the device that will not respond to a load of sufficient magnitude to prevent an overheating condition in the wiring of the circuit or in the device itself; and/or (t) contains a fuse that may blow during testing that is within the interrupter's specified operating range (for instance, an 800-amp current for ½ cycle of AC power) or would not respond in a potentially dangerous situation (for instance, a 40-amp overload of extended duration on a 20-amp circuit).

SUMMARY OF THE INVENTION

Accordingly, the present invention provides an instantaneous circuit interrupter tester that:

(a) can be used to test circuit breakers to see if they respond properly to an overload or short (circuit breakers can become faulty over a period of time from aging of inner spring elements or from corrosion due to influences such as moisture and humidity);

(b) will work predictably, efficiently and repeatedly without damage to the device;

(c) will not require the user to visit the breaker panel;

(d) will not require switching off breakers other than the one in question;

(e) is presented in a single package;

(f) works without removal of the breaker from the panel;

(g) will trip the breaker from the location where one wishes to work;

(h) will not trip the GFI while testing or tripping the circuit breaker (regardless of whether it is a GFI circuit breaker or not);

(i) will test the instantaneous tripping capability of the interrupter without causing the thermal sensor portion of the interrupter to trip;

(j) will dissipate a minimum amount of heat;

(k) can be used at any contact point in the circuit without damaging the device of the present invention;

(l) will not present a danger in the event of the interrupter malfunctioning;

(m) will operate for a relatively short period of time resulting in less total wattage being drawn through the circuit;

(n) will have a switching device that is not subject to arcing damage;

(o) will selectively and separately test different types of instantaneous circuit interrupters;

(p) will test that a circuit interrupter's interrupting capability is equal to or greater than the interrupter's actual specifications; and/or (q) (r) (s) will incorporate an interrupter within the device that will allow loads of required magnitude during normal testing without opening, while opening the circuit within the device in situations where the device misbehaves, such as if the switching element fused closed while a circuit breaker does not open. For instance, if the switching device fused shut, but the impedance of the circuit was high enough to prevent a load of sufficient magnitude to trip the breaker or if the breaker was malfunctioning, then one could have the potential situation of a large-enough current being drawn to overheat the wiring or the device thus presenting a fire hazard.

Further, in the case of testing circuit breakers, my invention is not polarity sensitive, meaning that it will function correctly even if the neutral and charged wires, to which it is connected, are reversed.

Additionally, in some embodiments, my invention provides a light to indicate if the circuit is energized or not and/or a light to show whether the load resistor has blown.

Another feature is the incorporation of one or more means of turning off the current through the device in case of a faulty circuit breaker in the existing circuit.

A further embodiment of the present invention has the initial test performed concomitantly with a measurement of the amperage of that test. If the amperage is below a predetermined measure, then the resistor is switched out of the circuit and the test can be repeated with either a smaller value resistor or no resistor at all.

This invention of this disclosure deals with both the safety and effort issues by providing a simple, inexpensive, portable device that both tests an instantaneous circuit interrupter and turns off the power from the location where the person wishes to work. The power is effortlessly turned off and thus the circuit breaker to that outlet is instantly located and identified.

It is the intention of this disclosure to put into possession of the public means for designing and building a remote control circuit interrupter test device with optimum characteristics of accuracy, effectiveness, durability and safety.

It is interesting to note that, while in the process of developing the device of the present disclosure, I have been told by electrical engineers and manufacturers that the SCR will burn out, that the load resistor will burn out, that there isn't enough power in the electrical system to allow the device to work, that such a large current surge will prevent the timing circuitry from working reliably, that it will cause fires in the wiring of the circuit breaker and so on. They say either it won't work, or if it does work, that it will fail during testing or if it works once, it won't work again if the breaker doesn't trip. In actual use the device does work, as expressed, for instance, in that it does trip circuit breakers that are operating within specifications in a wiring circuit at is up to code. It also works in that when presented with a breaker that will not trip, one can repeat the test repeatedly. And the prototypes tested simply haven't burned out. It is believed that at least part of this is the lack of understanding about electricity's characteristics during fractions of a second. For instance, a circuit breaker that "sees" a single half cycle of 60-Hz electricity "feels" a magnetic field that can trip it, yet the total current, and thus heat generated, is much less than is generally realized. An ampere is a unit of charge per second. A certain number of electrons moving per second. When one 120th of a second is viewed, the current is one 120th of the amperes that some people suppose is in action. Additionally, a material that is rated in watts, such as a 50-watt resistor, is utilizing a measurement of amperes time volts. Thus watts is a time dependent unit of measure. Since the wattage of a resistor is a measurement of the amount of heat generated that it can withstand, and that heat is created over time, there can be dramatically different performance when the time the resistor is exposed to the current is extremely short. By analogy, a person will burn their finger if it is held over a flame, but if the same person moves the same finger through the same flame quickly, there is no damage to their skin. A measurement of the temperature of the flame may indicate that the finger should have been burned, but in actual practice it is not. Having pointed this out, it may now seem obvious, but this aspect of electricity's effects being time dependant have not been applied to circuit breaker testers before the device of the present disclosure.

An instantaneous circuit interrupter tester is provided by a device including a high current switch controlled by a timing circuit that allows current to flow through the switch and a series resistance for a time period and in units relative to the sine wave of the circuit to which the device is connected. The user connects the device to the circuit of the circuit interrupter by means of, for instance, prongs that mate with an wall outlet. An indicator, such as a light or meter, indicates whether there is power to the outlet. Pressing a button activates the timing circuit, which it turn activates the switch and current flows limited by the internal resistor of the device. By limiting the on time of the device to multiples of half cycles the user can test if the circuit interrupter is actually capable of responding as specified by the manufacturer. Further, by limiting the test to such short periods, the circuit interrupter and its associated circuit wiring and receptacles are subject to a minimum of stress.

It is a feature of this device that it can be used to test circuit breakers or ground fault interrupters. The only adaptation requirements being which contacts in the outlet are used and the size of the resistance element. Dual resistances and a switch can make a single device capable of selectively testing either type of interrupter.

The present invention provides a simple and effective way to test the instantaneous-trip function of a circuit-interrupter. One aspect of the invention provides a tester for a circuit-interrupter, wherein the circuit-interrupter includes an overload-trip function and an instantaneous-trip function. This tester includes an electrical plug having a first external electrical connector and a second external electrical connector, a control circuit that outputs a control signal, an electronic switch selectively enabled by the control signal, and an electrical load connected to the electronic switch such that the electronic switch connects the electrical load to the first external electrical connector and the second external electrical connector as controlled by the control signal, wherein the electrical load is sufficient to trigger the instantaneous-trip function of the circuit-interrupter.

In some embodiments, the control signal enables the electronic switch to conduct limited to a time no greater than a pre-specified maximum trip time of the instantaneous-trip function. In some embodiments, the pre-specified maximum trip time of the instantaneous-trip function is three cycles of AC power. In some embodiments, the electronic switch is enabled to conduct for a time no greater than about one-half cycle of AC power.

Some embodiments further include a ground fault tester circuit that comprises a small current load selectively coupled between the first external electrical connector of the plug and a third external electrical connector of the plug.

Another aspect of the present invention provides a method of testing a circuit-interrupter, wherein the circuit-interrupter includes an overload-trip function and an instantaneous-trip function. This method includes receiving a manual stimulation indication, and selectively connecting an electrical load to wires connected to the circuit interrupter based on the reception of the manual stimulation indication, wherein the electrical load is sufficient to trigger the instantaneous-trip function of the circuit-interrupter.

BRIEF DESCRIPTIONS OF THE DRAWINGS

FIG. 2A is a perspective view of a circuit breaker interrupter/tester 200 embodying features of the present invention.

FIG. 2B is a perspective view of a circuit breaker interrupter/tester 201 embodying features of the present invention.

FIG. 3 shows the relative positions of the device of this disclosure and the elements of the existing electrical system.

FIG. 6 is a graph 600 displaying variations in amplitude of an AC electrical sine wave subsequent to turn on.

DESCRIPTION OF PREFERRED EMBODIMENTS

Figure 1A:
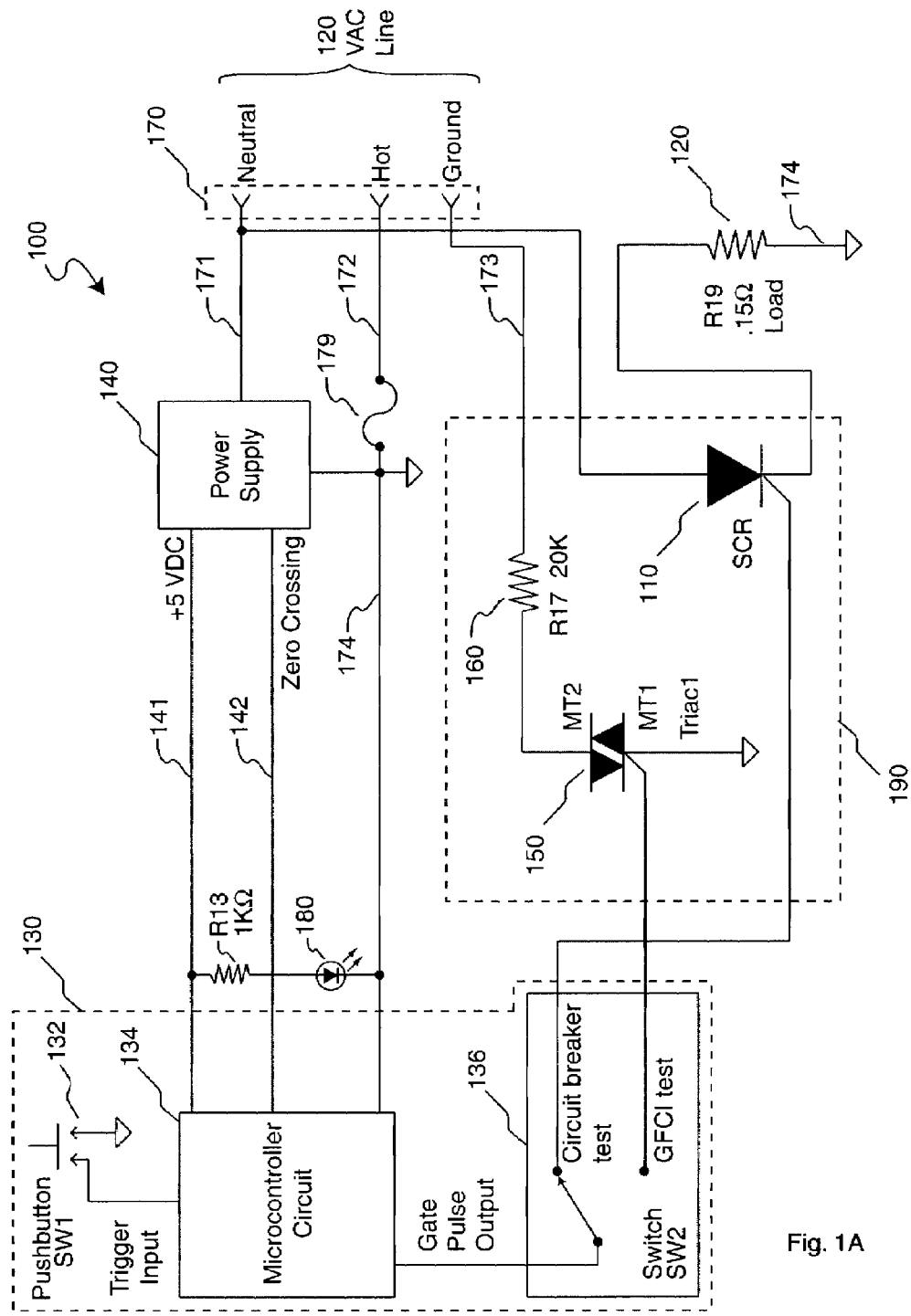
FIG. 1A shows a simplified schematic of tester circuit 100 of one embodiment of the invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component that appears in multiple Figures. Signals and connections may be referred to by the same reference number or label, and the actual meaning will be clear from its use in the context of the description.

Another further embodiment of the present invention includes multiple selectable load circuits, for example, by having a switch that selects from a plurality of values for load resistor 120. Thus one could perform tests of either low and high current loads, and still be able to limit the time or number of half cycles during which the excess current is drawn. This could be accomplished, for instance, by a selector switch to select between two different parallel loads each in series with a single SCR switching element. Another method to accomplish this would be to have two loads, each in series with its own SCR switch and a selector switch between the timer and the SCRs. One advantage to the latter method is that a smaller switch could be utilized as it would only be carrying the current necessary to turn on the SCRs.

Another further embodiment of the present invention is to have a circuit that presents a relatively high resistance load (i.e., low amperage) between the hot and ground terminals to test a GFCI.

Another further embodiment of the present invention is to have switchable means to perform the same test accessing either the hot and neutral wires or the hot and ground wires. This would be of advantage in accessing the quality of the ground. Additionally, if the neutral wire does not make a good connection but the ground wire does, then the breaker could still be tested. Obviously it is also possible to connect the hot wire to both the neutral and ground wires simultaneously.

U.S. Pat. No. 2,976,484 (McClain Mar. 21, 1961) is a circuit fuse locator. It is basically a device with a plug leading to two parallel circuits, one of which has a pilot light and the other has a switch and a fuse. It is plugged into a receptacle leading to a fuse of lower amperage rating than the fuse in the device. By closing the switch the circuit is shorted resulting in blowing the fuse protecting the receptacle. In the event of the fuse protecting the receptacle being rated larger than the fuse in the device, the fuse in the device will blow, protecting the circuit and the switch. I have built and tested this device and it works as claimed with fuses and fuse panels. However, it does not work effectively and predictably with circuit breakers. In experiments with a receptacle leading to a circuit breaker, the device will usually both trip the breaker and blow the fuse in the device. Sometimes the fuse in the device will blow, but leave the circuit breaker unaffected. Either way the fuse in the device would usually have to be replaced with each usage on a circuit protected by a circuit breaker. Thus although this device is a circuit fuse locator, it was not intended to be nor can it be considered a circuit breaker locator.

One might think that it would be obvious to simply remove the fuse in the device, but no one has advanced such an idea since U.S. Pat. No. 2,976,484 was issued. The obvious reason is that if you have no fuse in this device, there are at least two potential deleterious side effects. First, in the case of a faulty circuit breaker that would not trip off, the main limit to the length of time the short circuit would be sustained is how long it would take to overheat the wiring and switch and eventually melt one or both of them and thus open the circuit. Second, the switch contacts will wear out due to arcing or overheating.

Another category of device has been invented to identify a single circuit breaker among a plurality of circuit breakers that involve some type of transmitter and a separate receiver. One of these is placed at or near the circuit breaker panel and the other somewhere in the load side of the circuit of the breakers. The transmitter sends some type of signal through the wires, which is sensed by the receiver, thus determining which wire or receptacle goes with what breaker.

One such device (Konopka U.S. Pat. No. 4,906,938) is placed in the outlet that sends a signal to the panel. A detection device held to the panel senses which circuit is receiving the signal. This requires a trip to the outlet to plug in the transmitter, then to the panel to use the sensor and manually turn off the breaker and back to the outlet to get to work.

Another device connects an electrical noisemaker to an outlet. Then the user goes to the panel and flips breakers until the noise either ceases or starts (Peak U.S. Pat. No. 4,725,772 and Peak U.S. Pat. No. 4,816,746). This is a variation on the time-honored trial and error practice of plugging in a loud radio and then going to the panel and flipping breakers until the radio turns off (or on). Aside from the effort of going to the panel, which my invention eliminates, the turning off and on of multiple breakers means any devices on those circuits that rely on uninterrupted power (such as digital clocks) will have to be reset.

Yet another device requires removal of the breaker and utilizes, among other components, one or more transformers, coils, relays and a voltmeter to generate and measure the exact amount and duration of current necessary to flip the breaker (Elder U.S. Pat. No. 3,678,372). Although it is a wonderful testing device, it does not address the problem of turning off the breaker from the outlet.

U.S. Pat. No. 4,803,434 to Walker describes a tester that connects directly to the breaker in the panel. Although a spectrum of resistances are incorporated into the testing circuit in order to test either the instantaneous or thermal breaker elements, no mention is made of any specific timing circuitry. It seems to be intended to test specialized circuit breakers that incorporate three leads and an electronic trip component. The device of the present invention specifically includes a timing means for controlling the length of the test of the circuit breaker or interrupter whose advantages are described in depth elsewhere in this document.

U.S. Pat. No. 3,852,660 to Maier and Shimp also describe a tester that connects to a set of special input terminals on a molded circuit breaker. The device is limited to breakers having such special terminals. The device of the present invention does not have this limitation as it is designed to be used anywhere in the circuit of the circuit breaker to be tested.

U.S. Pat. No. 5,812,352 to Rokita and Davis tests overloads as opposed to short circuits. It places an overload on a circuit breaker, which, in some embodiments, is two times the breaker's rating. For instance, to test a 15-amp circuit, a 4-ohm 500-watt resistor is specified, which results in a 30-ampere load. It will be apparent by looking at FIG. 4 that such a load is two times the breaker's rating which should result in the breaker being tripped in between 15 and 100 seconds. Although such a load should not harm most breakers, the wiring of the circuit between the device and the breaker is subjected to considerable heating. Also, Rokita's tester is testing the breaker's bimetallic thermal element, which responds to the heating effect of the current through the breaker. It is not a large enough load to test the "instantaneous" magnetic element that responds to the magnetic field produced by current through the breaker. Additionally, the 500-watt resistor is physically very large, which makes the device less convenient to carry about. Also, the process of the current flowing through this resistor will generate considerable heat that would have to be dissipated.

U.S. Pat. No. 5,736,861 to Keleher and O'Neal describes a circuit breaker tester that measures the impedance of the circuit the device is connected to and then, if the impedance is within specified parameters, which are the safe operating range of the circuit breaker tester, a timer closes a relay that applies a short circuit across the active line. If the measured impedance is not acceptable, the device will not allow the user to test the circuit. As this device relies on the wiring to supply at least a minimum impedance, if it is used too close to the breaker there would be insufficient impedance to allow operation. Thus some outlets could not be used as testing points, or if the entire circuit is too short it could not be tested at all. Further, the timer that operates the relay is specified as having a duration of from 0.1 to 10 seconds. As circuit breakers normally are rated to trip within 3 cycles of AC power, or 0.05 second, it is apparent that the actual specifications of the breaker are not being tested. In other words, it may test if the breaker works at all, but not if it is functioning within actual specified parameters. With their device the breaker could pass the test when in actual fact it would not trip as intended by the manufacturer. This could lead to a breaker being thought of as safe and thus being kept in service when in actual fact it could lead to a hazardous situation.

Additionally, the extended period of time that the tester is on can lead to excessive heating of the circuit's and the device's components. What is desired is a circuit breaker tester that will test the breaker's actual specifications or perform an even more exacting test. Thus a breaker that passes this test is then known to either meet or exceed the manufacturer's specifications. Additionally it is desirable to have a tester that can be implemented at any point in the circuit, regardless of how near to the circuit breaker. The defining aspects of such a tester are twofold, first that the time the load is on is either equal to or less than the rated tripping time, and that the sum total of the impedance of the circuit and the device be sufficient to be within the safe operating area of the circuit breaker tester's load switching device while producing a load of sufficient magnitude to meet the tripping requirements of the circuit interrupter. The total stress placed on the circuit and the tester will be minimized proportionally as the time the tester is on is shortened. Additionally Rokita's device requires doing an impedance measurement before testing the circuit breaker. The device of the present invention allows testing immediately upon connection to the circuit of the circuit interrupter, saving time for the user.

U.S. Pat. No. 5,736,861 to Keleher and O'Neal (column 2 lines 21 to 27) also describes a circuit breaker tester that includes a fuse specified as "a high current, quick blow, 1000-amp rated device." It further states this fuse "is selected to have a characteristic that will not allow it to blow under the range of conditions normally found in typical branch circuits that are shorted for two seconds or less. Such fuses are commercially available." In the same column, lines 66 and 67, the on time of the device is described as "That time is preferably set to a value between 0.1 to 10 seconds." Two problems may arise out of selection of such a fuse as they specify. First, if there is a fault in the testing device that allows an overcurrent of, for example, 100 amps, the device's fuse will see this as a normal load so this overcurrent could continue long enough to cause damage to the circuit connected to the circuit breaker without causing the fuse to blow. If the circuit breaker of the circuit were to be faulty, there would be little or no protection at all. Second, the fuse is rated to withstand a short circuit for two seconds, but the test, which can allow a very high current, for example, 800 amps, is specified to continue up to 10 seconds. Although 800 amps is not the same as a true short circuit, if the fuse allows this amount of current to pass in a normal test, it could cause damage to the circuit of the circuit breaker.

In contrast, what is desired in the present invention is a fuse or other overcurrent protection device that will allow a short surge of current but not allow moderate overcurrents for longer than is safe. For example, a fuse that will allow a half-cycle surge of current of 800 amps, but open after some safe time length if there is a continuous overcurrent of 40 amps. Happily, the resistor that is used as a load in the device of the present invention functions in exactly this way. It can withstand a half cycle of high amperage current, but will open (by melting) with a prolonged current, even a relatively small prolonged current. Also, a small gauge wire such as copper or nichrome wire can be incorporated as a fusible link by having it in series with the large SCR 1110 and load 120. It is simple to perform tests to select what is the smallest gauge wire that can be used repeatedly, while still being small enough to provide circuit protection.

U.S. Pat. No. 5,736,861 to Keleher and O'Neal further describes using a relay switch that is intrinsically incapable of the short time periods of which the device of the present invention is capable. Relays are mechanical devices that must move physical contacts a distance, which limits the speed at which they can switch, and thus cannot close and open in less than a certain specified minimum time that is much greater than that of semiconductor devices. This is a further limitation when one is trying to have the circuit close at a zero cross moment. The relay works by building up a magnetic field in a coil that causes the contacts to move. The time it takes to charge the coil and then move the contacts makes trying to hit right on a zero-cross moment, or a controllable point relative to the zero-cross moment difficult or impossible.

Another class of prior invention that either tests ground fault interrupter circuit breakers (Strock U.S. Pat. No. 3,898,557 and Rocci U.S. Pat. No. 3,984,765) or whether the ground and hot, and neutral wires are correctly installed (Donahue U.S. Pat. No. 3,205,436, Solgere U.S. Pat. No. 3,263,164, Shapiro U.S. Pat. No. 3,668,518 and Spear U.S. Pat. No. 3,952,244). Ground Fault Interrupters (GFIs) turn off a circuit breaker in an outlet when a leakage of current to the ground is detected. These GFI testing devices test the connections between the hot and neutral conductors in various ways to verify if the GFI is functioning properly. This test does not extend to the circuit breaker at the panel. In other words, the leakage of current to ground may turn off the GFI breaker, but does not turn off the circuit breaker at the panel (unless the circuit breaker is a special GFI circuit breaker). Generally these devices produce a simulated ground fault by connecting the hot and ground contacts via a resistor. A very small current is allowed that is within the GFI's specifications. However, the test generally lasts as long as the user holds their finger on the testing switch. Obviously this does not test if the GFI will, for instance, trip within one and a half cycles of AC power, as is a common specification for such devices. It would be desirable if the test period was equal to or less than the actual rated tripping time.

One other useful aspect of the device of this disclosure addresses testing nuisance tripping (the high inrush of current during the first half-cycle of applied power, for example, when initially applying electrical startup power to a motor). With the load set from between six and thirteen times the FLA (Full-Load Amps, the amount of current a motor can be expected to draw under full load (torque) conditions when operating at the rated voltage), one can test the nuisance trip setting of an instantaneous interrupter. It is essentially the same test as stated elsewhere in this disclosure, except the results are to have the breaker not trip in a situation which simulates the normal high inrush current of a motor, yet to trip in a situation when this is exceeded. The six to thirteen times multiple of FLA are given here as examples of typical inrush current multiples of normal and high efficiency electric motors, respectively. Obviously multiples of LRA (Locked-Rotor Amps, the amount of current the motor can be expected to draw under starting conditions when full voltage is applied) and other electrical ratings can also be tested. As motors and standards evolve, these can be adapted to with varied loads and time lengths of testing. Obviously the safe operating area of the components of the tester must be sized appropriately to the magnitude of testing current and the time length of the test. For example, with a 40-amp-rated motor which may have a seven times full load current at startup for a half-cycle of AC power multiple tests could be run. For instance, one with a seven times FLA for a single half-cycle, which should not trip the instantaneous interrupter. Secondly, for example, a two-full-cycle test (four half cycles) with seven times the FLA, which should trip the instantaneous breaker. As noted elsewhere, although four half-cycles can be used in testing, one can also test with two half-cycles during two full-cycles (half-cycle on, half-cycle off, half-cycle on, half-cycle off) or two half-cycles on during one and a half-cycles (half-cycle on, half-cycle off, half-cycle on). Obviously other combinations of current magnitude, testing time length and on/off patterns of half-cycles can be applied.

Accordingly, the nuisance trip test enables testing of not only at what magnitude of current the instantaneous interrupter trips, but also at what point in time relative to the AC sine wave. Thus, testing of fixed and adjustable instantaneous trip settings as concerns multiples of FLA is enabled.

Figure 1B:
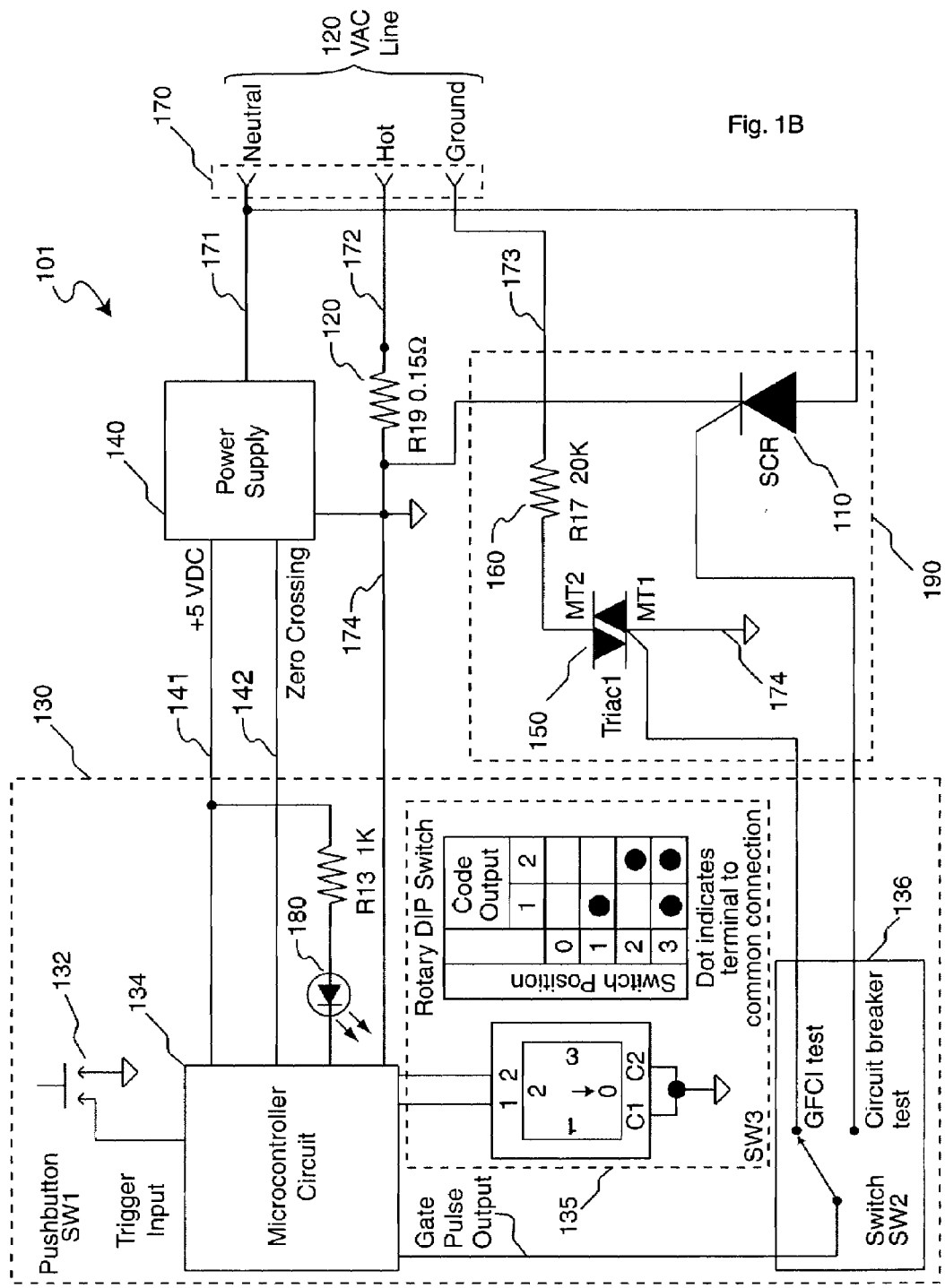
FIG. 1B shows a simplified schematic of tester circuit 101 of one embodiment of the invention.

FIG. 1A shows a schematic of tester 100 according to one embodiment of the invention. Tester 100 includes connection 170 to the circuit of the instantaneous circuit interrupter, power supply 140 having DC output 141 and zero cross connection 142 to the microcontroller 134. In some embodiments, connection 170 includes hot prong 172, neutral prong 171 and ground prong 173. Controller circuit 130 includes microcontroller circuit 134 (used for timing control), optional selector 135 (such as shown in FIG. 1B) to choose length of test period, trigger input 132 (e.g., a momentary-contact switch), optional selector switch SW2 136 (which, in some embodiments, chooses which test is to be run (instantaneous or GFCI)). Some embodiments include load resistor 120 (e.g., resistor/fuse R19), which acts as a high-current load (e.g., 0.15 ohms, 50 watts). In some embodiments, this resistor 120 acts as a fuse that opens if a high current is seen for too long a period, such as a failure of SCR 110 that shorts it, or a failure of controller 130 that turns the SCR 110 on for too long a period of time.

Figure 9:
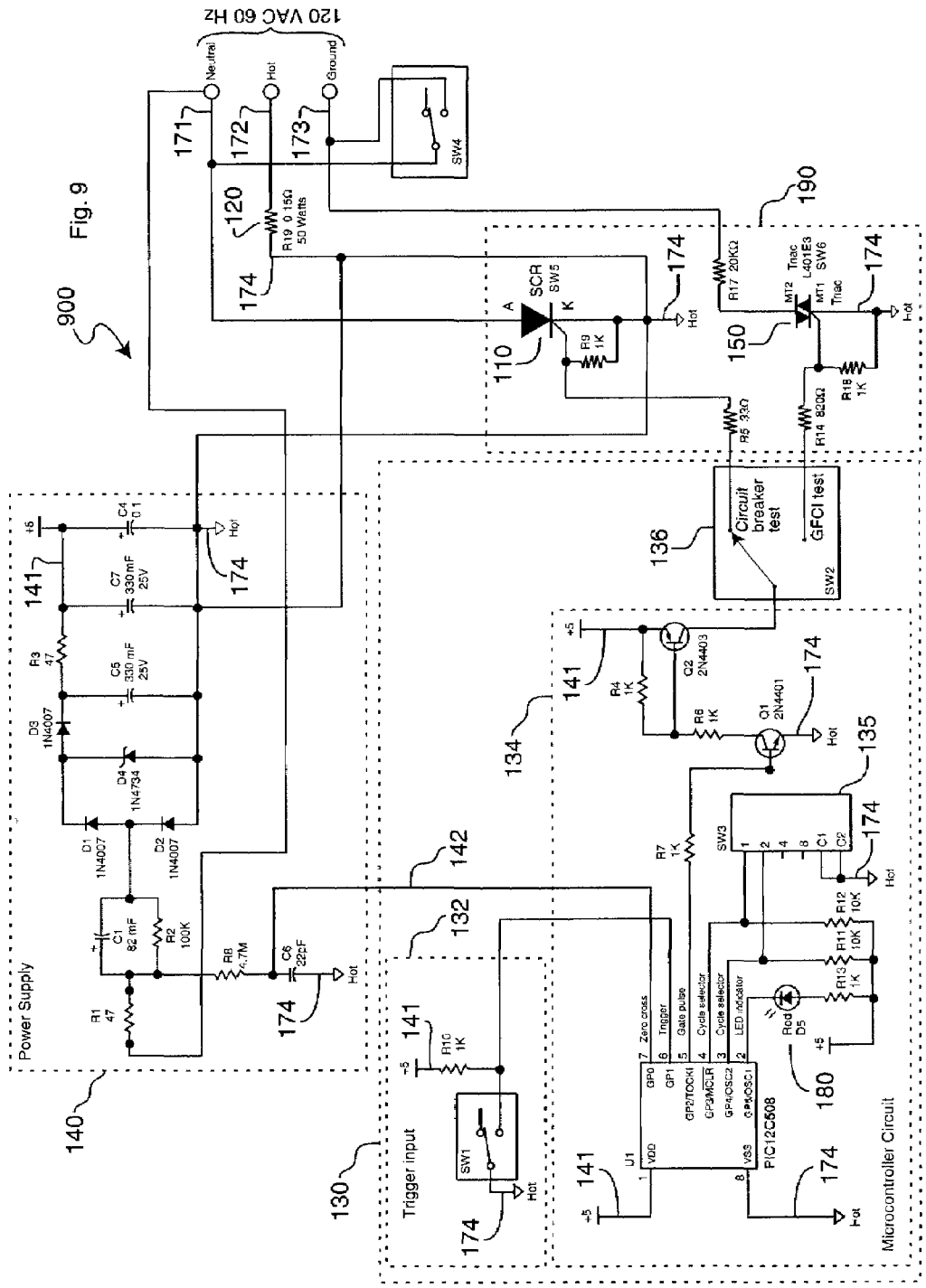
FIG. 9 is a circuit diagram of one embodiment of the device.

In some embodiments, a switch (such as shown in FIG. 9 as SW4) is provided in conjunction with load resistor 120 to select from among a plurality of load resistances for load resistor 120. Thus, a resistance can be selected to test the instantaneous-trip function, or to test the overload-trip function, or to test that the nuisance-trip function (i.e., that the circuit breaker does not trip as a result of applying a a slight overload for a limited period of time, for example, simulating a motor startup procedure).

In some embodiments, a slow-blow fuse or fuseable link 179 is provided in series between hot line in 172 and the internal hot connections 174 (which is also used as the low-voltage ground), while other embodiments omit this fuse. Some embodiments include power indicator/ready-to-use indicator 180 (e.g., LED D5 and an appropriate load resistor R13, connected, for example, to either the power supply as shown in FIG. 1A, or to an output of controller 134 as shown in FIG. 1B). For testing the instantaneous interrupter function, circuit 100 also includes electronic switch 110 (in some embodiments, an SCR is used, since a triac may not switch off as readily). In some embodiments, gating element 150 (In some embodiments, a triac) is included and used to divert a small current through resistor 160 (e.g., R17, in some embodiments, is 20,000 ohms) between hot conductor 172 and ground conductor 173. Some embodiments further include a switch (not shown) to tie ground and neutral together).

The electronic switching elements 190 thus can include a tester for one or more of GFCI function, short (instantaneous-trip) function, and/or overload (thermal-trip function). In each case, tester 100–105 includes one or more controllers 130 that stop conduction of the respective trip-testing function at a predetermined point in time that is related to the specified trip time of the circuit interrupter being tested.

For example, for testing an instantaneous-trip function of circuit interrupter that specifies that it is to trip within $\frac{1}{20}$ of a second (3 full cycles of 60 Hz AC), the switching element 110 conducts for a half cycle in some embodiments (in other embodiments, two, three, four, five, or six half cycles of conduction are used). In some embodiments, non-consecutive half cycles are used.

For another example, for testing a GFCI-trip function of circuit interrupter that specifies that it is to trip within $\frac{1}{20}$ of a second (3 full cycles of 60 Hz AC), the switching element 110 conducts for three consecutive half cycles in some embodiments (in other embodiments, one two, four, five, or six half cycles of conduction are used). In some embodiments, non-consecutive half cycles are used.

For yet another example (see FIG. 1F), for testing an overload-trip function of circuit interrupter that specifies that it is to trip within 100 seconds (6000 full cycles of 60 Hz AC), the switching element 111 conducts for 12,000 consecutive half cycles in some embodiments (in other embodiments, other numbers of half cycles of conduction are used). In some embodiments, non-consecutive half cycles are used.

Some embodiments also include GFCI tester that includes triac 150 and a low current/high resistance (e.g., about 5.5 milliamps/ about 20K ohm) resistor 160. Switch 136 can be switched so that the gate pulse output goes to the gate of triac 150 (instead of to SCR 110) to test the GFCI function by diverting about five mA to the ground, thus creating an imbalance between the current in the hot conductor and the current in the neutral conductor. In some embodiments, triac 150 is triggered in each of three consecutive half cycles (e.g., negative going, positive going, and negative going). In other embodiments, other numbers of half cycles and other patterns of triggers are used (e.g., four consecutive positive-going half cycles, without conducting during the intervening negative half cycles). In other embodiments, an SCR is used in place of triac 150.

FIG. 1B shows a simplified schematic of another embodiment 101 of the invention. This circuit is substantially identical to that of FIG. 1A, except, in this embodiment, resistor 120 is moved to the closest connection to the hot terminal, in order that most failures or shorts within circuit 101 would cause resistor 120 to open (i.e., act as a fuse). FIG. 9 shows a complete circuit 900 that represents one embodiment of tester 101 of the invention shown in FIG. 1B.

In a device 100 or 101 as described above, the manual action needed to activate control circuit 130 is pressing push button switch 132.

Figure 1C:
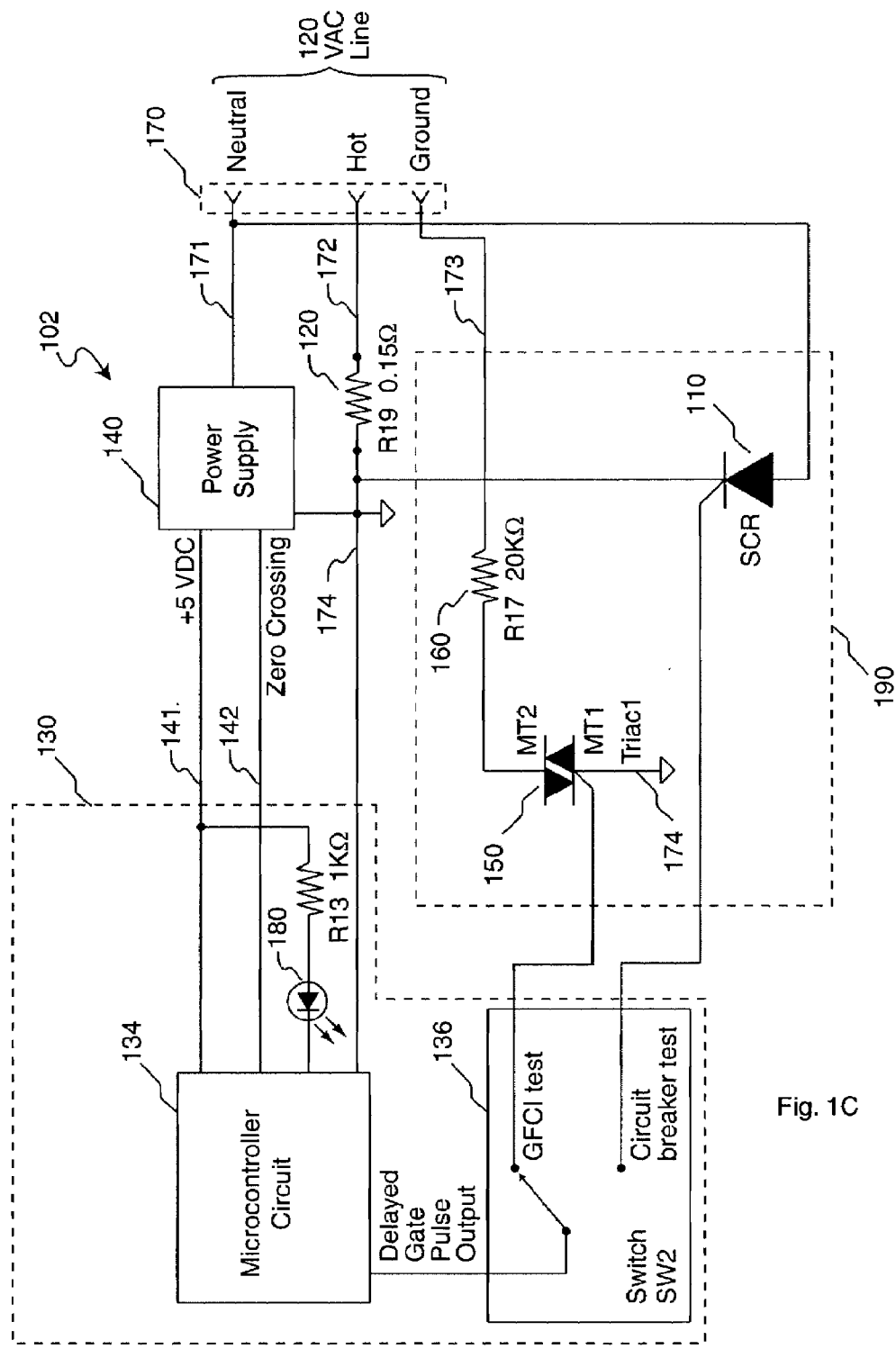
FIG. 1C shows a simplified schematic of tester circuit 102 of one embodiment of the invention.

In other embodiments, e.g., circuit 102 as shown in FIG. 1C, controller circuit 130 omits switch 132, and instead controller circuit 130 provides an initial delay after power is supplied (e.g., about ten seconds in some embodiments; but other embodiments use other delay times, such as about one second, about two seconds, about five seconds, about twenty seconds, about 40 seconds, or any other suitable time period (generally, a human-perceptible time period, in order that the user will see the light 180 being on and then turning off)), and then provides one or more pulses to turn on SCR 110. Eliminating this switch 132 can reduce cost, increase reliability, and obviates the need for pushing the button at the device, thus allowing the user to plug in the device at an outlet remote from the breaker panel, then go to the breaker panel and switch on the circuit breaker being tested to see whether the circuit breaker is tripped at the set delay time (e.g., ten seconds after power is applied). This can provide additional safety, in that the user plugs the tester device into an inactive circuit, and, since power is applied by the user at the panel, the user can manually switch off the breaker if it does not get triggered in the appropriate amount of time (perhaps replacing it with another breaker).

Thus, the manual action used to trigger circuit 100–105 could be just plugging the device (102 or 103) into an active circuit and waiting the delay period, or plugging the device (102 or 103) into an inactive circuit, then activating the circuit breaker being tested and waiting the delay period (e.g., 10 seconds) to see that it tripped as it was supposed to.

Figure 1D:
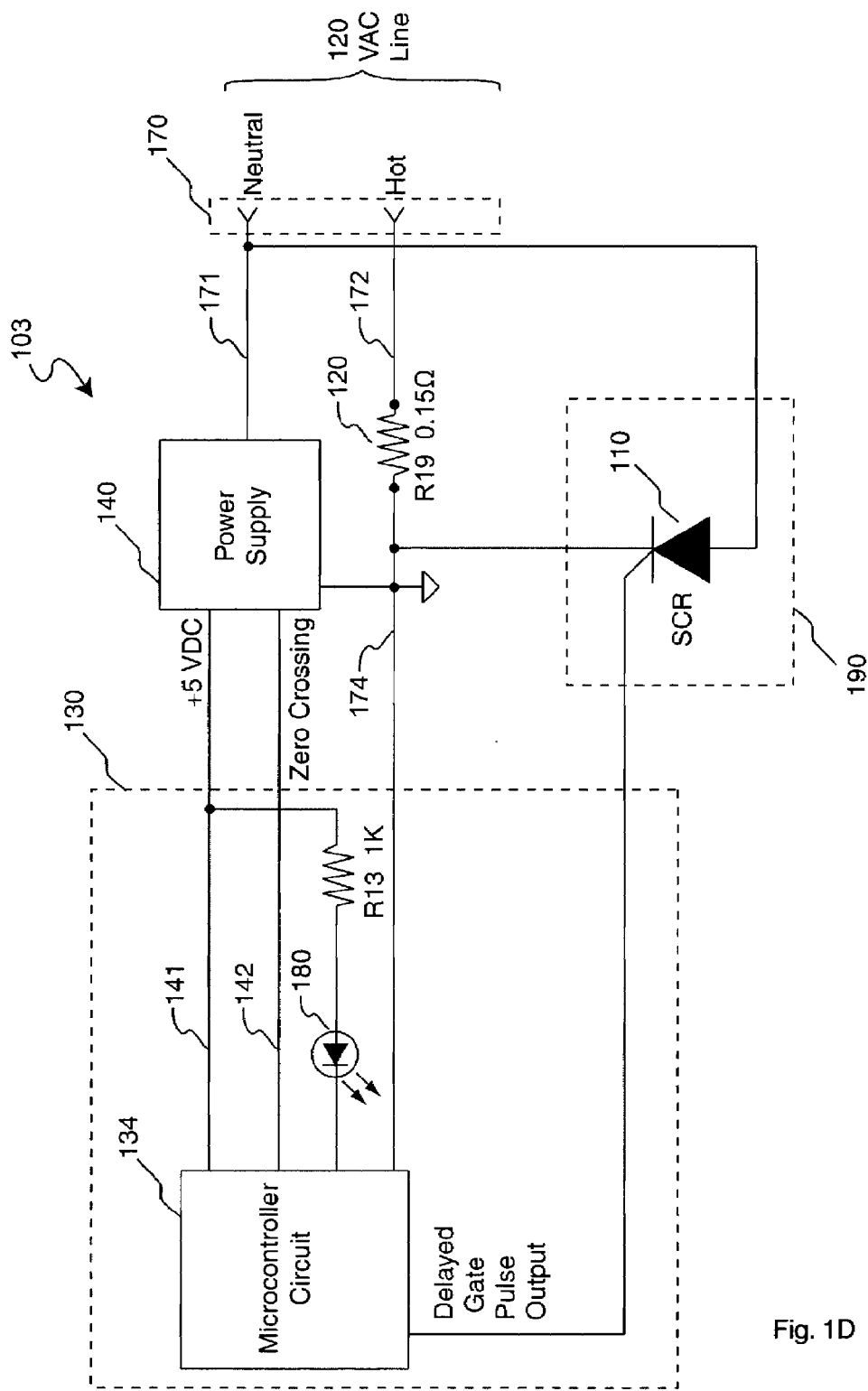
FIG. 1D shows a simplified schematic of tester circuit 103 of one embodiment of the invention.
Figure 1E:
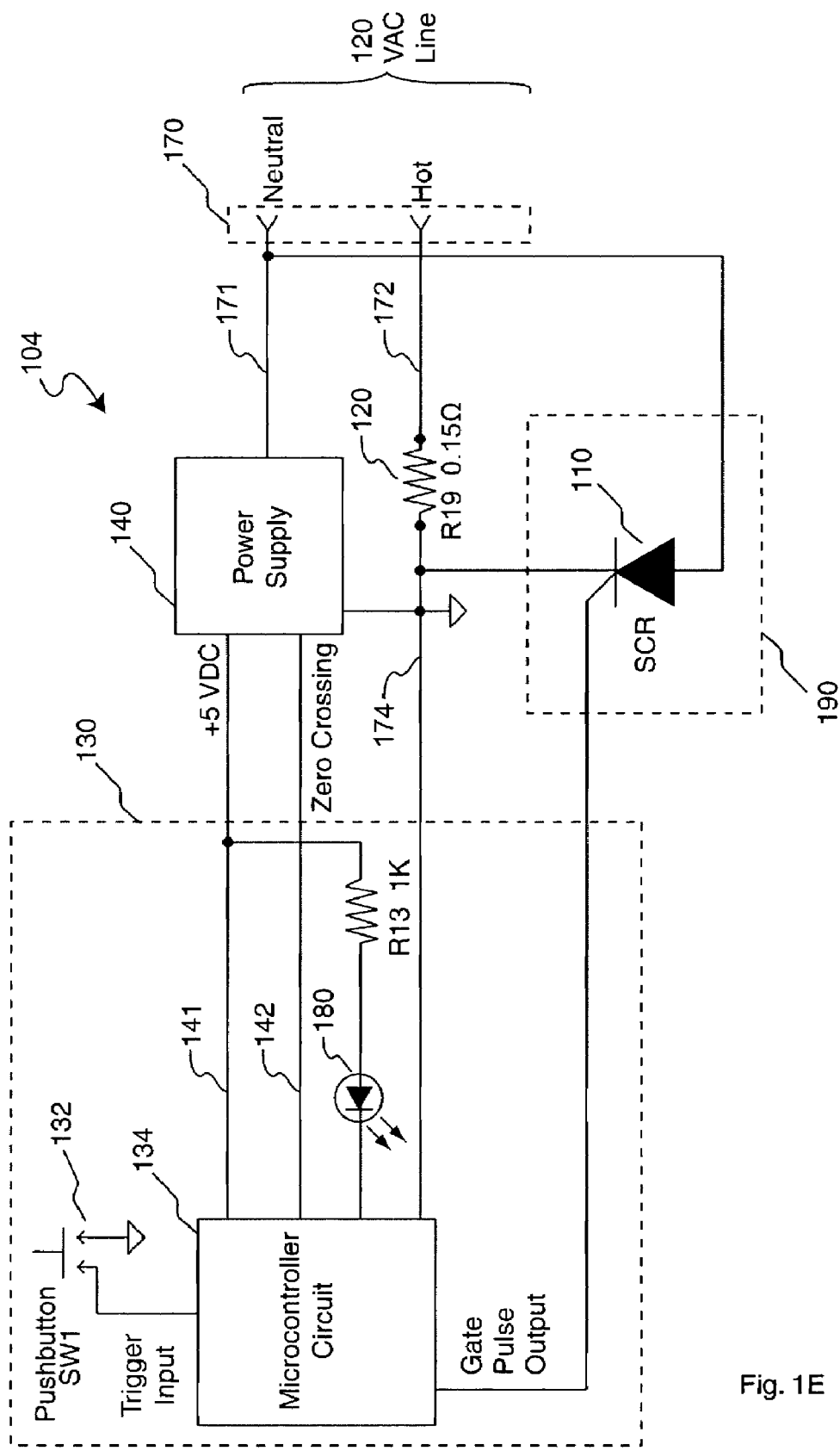
FIG. 1E shows a simplified schematic of tester circuit 104 of one embodiment of the invention.

In some embodiments (either circuit 104 with switch 132 as in FIG. 1E or circuit 103 without switch 132 as in FIG. 1D, but otherwise as described above), controller circuit 130 omits switch 136, triac 150 and resistor 160, thus omitting the GFCI testing function, and simply providing the instantaneous trip-testing function of SCR 110.

Figure 1F:
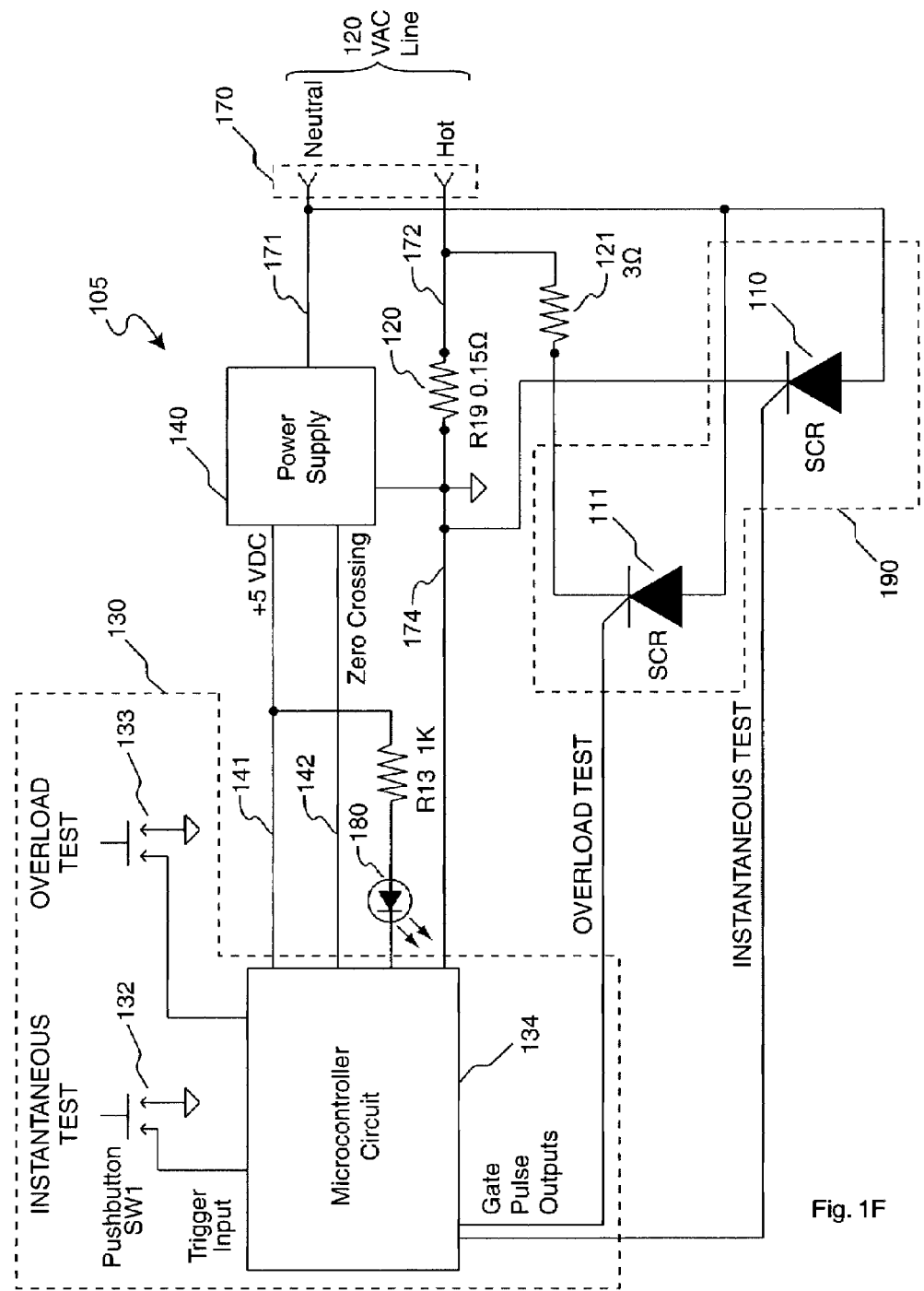
FIG. 1F shows a simplified schematic of tester circuit 105 of one embodiment of the invention.

In some embodiments such as shown in FIG. 1F, (either with or without the GFCI testing function) an additional SCR 111 (like 110) and resistor 121 (like 120, but of a higher resistance (e.g., 3 ohms, and thus lower current of less than ten times the rated current) are provided, and another trigger is provided by switch 133, thus providing a test of the thermal-trip (i.e., an overload equal to a low multiple of the rated current of the circuit breaker 338 (see FIG. 3)) function of the circuit breaker being tested. In such embodiments, controller 130 provides a larger number of pulses to this additional SCR 111 (perhaps 6000 pulses to obtain 100 seconds of overload, in some embodiments).

For the above embodiments, resistor 120 is about 0.15 ohms, which limits the short-circuit current to about (110 volts to 120 volts)/0.15 ohms, which equals about 733 to 800 amperes. Some embodiments will omit the current-limiting resistor 120, and instead will count on the internal resistance of the electronic switch 110 (or will incorporate a resistance into switch 110) along with the resistance of the wiring 320 (see below) to limit the current during the half cycle of switch 110 being activated. In some embodiments, a ground-fault-circuit-interrupter (GFCI)-type circuit breaker 327 (such as can be installed in an ordinary outlet box) is included in series with wires 320 and outlet 326.

FIG. 2A is a perspective view of an outlet-plug-type circuit breaker interrupter/tester 200 embodying features of the present invention. In some embodiments, the instantaneous circuit breaker tester 200 includes one of the variations of circuit 100–105 or 900, and is illustrated in several Figures of the drawings and is designated therein by the general reference character 200. Tester 200 includes plug 210 that connects to circuit 100, which is contained in box 224 (an insulating container, such as, in some embodiments, a thermosetting plastic (e.g., Bakelite TM)). Plug 210 can be any of the many connectors used in various outlets (two or three conductors as needed by circuits 100–105 or 900), or can be simply probes. In some embodiments, light 212 (e.g., the output of LED 180 if FIG. 1B) goes on indicating the circuit is live. When momentary switch button 207 is pressed, switch 132 is closed, and the timing circuit 130 is activated.

FIG. 2B is a perspective view of a socket-plug-type circuit breaker interrupter/tester 201 embodying features of the present invention. Tester 201 is useful for testing circuit breakers that supply only lamp outlets, or for testing circuits that are inconvenient to test using a wall outlet tester such as tester 200 of FIG. 2A. In some embodiments, connection 211 includes hot prong 172 and neutral prong 171 as a lamp-socket plug at an end of box 225. Tester 201 can be screwed into a lamp socket that is attached to a circuit breaker being tested, and in some embodiments, includes a light 212 that is on when the circuit has power (i.e., after device 201 is plugged in but before it causes the circuit breaker being tested to break. Optional activation switch button 207 acts to activate control circuit 130. If button 207 is pressed and light 212 does not go off, this indicates a failure of the instantaneous break function of the circuit breaker being tested.

In some embodiments that omit activation switch button 207, light 212 will go on when tester 201 is initially plugged into an active circuit, then some short time thereafter (e.g., ten seconds, for example, as sensed by a timer or a circuit that counts the number of cycles or zero crossings of the AC line), controller 130 will activate electronic switch 110, and light 212 should turn off, due to the opening of the circuit breaker being tested. If the light does not turn off (after ten seconds, for example), this indicates a failure of the instantaneous break function of the circuit breaker being tested.

Unlike testers that introduce a permanent overload that lasts until the circuit breaker trips (thus risking overheating of the wiring circuit 320 (see below) and risking a fire if the circuit breaker does not trip as it is supposed to), a tester 201 (or tester 200) of the present invention will activate electronic switch 110 for only a partial half cycle, a half cycle, or just a few half cycles or full cycles and then will turn off the electronic switch 110 (e.g., stop triggering it).

In some embodiments, the instantaneous circuit breaker tester 201 includes one of the variations of circuit 103, 104, 105 or 900. This is electrically the same as the instantaneous-trip testing portion of circuit 101 of FIG. 1B.

FIG. 3 is a block diagram that shows the relative positions of the device of this disclosure and the elements of the existing electrical system. FIG. 3 shows one device of the present invention 200 connected to circuit 300 of breaker 338 of breaker panel 322 via circuit wires 320 and outlet 326. Upon turning on device 200, the momentary current surge in the AC line 320 is sensed by that circuit's circuit breaker 338 and causes it to unlatch. SCR 110 turns off at zero crossing so current ceases flowing. The circuit interrupter 338 continues its tripping action to completion where upon current through the circuit 320 leading to the outlet 326 and indicator light 212 goes out, indicating that point in the circuit is no longer live, and tester 200 is no longer powered.

Figure 4:
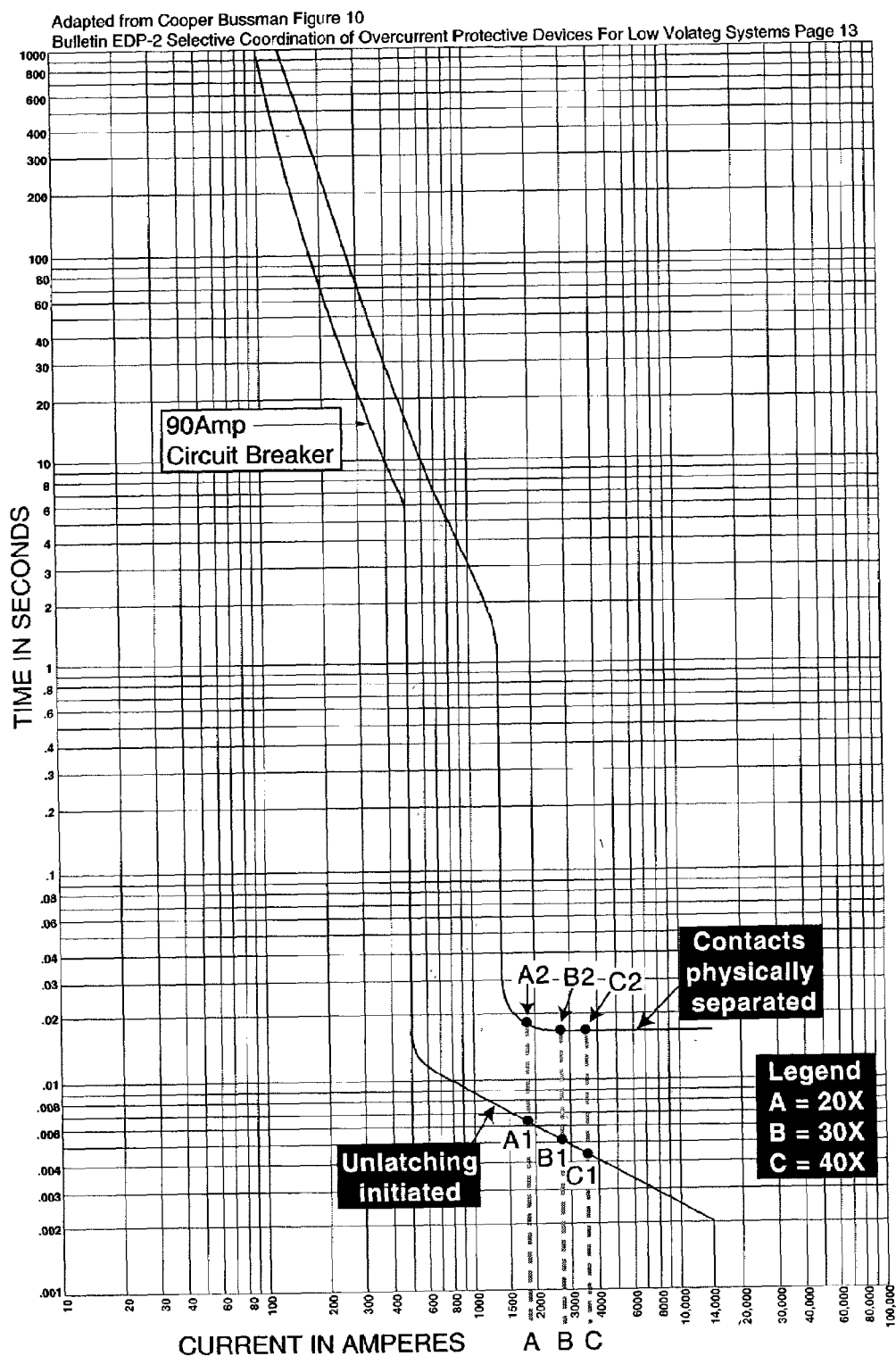
FIG. 4 is a log-log graph of tripping time vs. current of a sample 90-amp circuit breaker.

FIG. 4 is a log-log graph of tripping time vs. current of an exemplary or sample 90-amp circuit breaker. One aspect of instantaneous circuit interrupters that is overlooked is that they are designed to respond (interrupt current flow) to a relatively high amplitude of the sine wave of AC power flowing through them, as opposed to the thermal element in a circuit interrupter that reacts to accumulated heat resulting from relatively long overcurrents of relatively low levels (low multiples of the rated current). Thus, it is unnecessary to impress both halves (i.e., positive going and negative going) of the sine wave upon the instantaneous sensor to cause it to trip (even though the trip itself may occur later, for example, a single half cycle of high current can cause the trip to occur up to, e.g., three cycles later).

Utilizing half the sine wave will activate the tripping reaction and result in less heat generated (in device 200, as well as in the wiring of the house circuit being tested) during the test, since the short is removed, often before the trip has occurred. Even though many circuit breakers have arc suppression features, the clearing time can be up to three cycles (about 50 milliseconds) for many breakers, even though only a single half-cycle (about 8.3 milliseconds) of high current is sufficient to trigger the breaker to open. Tester devices that maintain the short until the breaker actually opens can cause excess stress in the breaker and the house wiring, since the short is maintained up to six times a long as should be needed to trip the breaker, and even longer if the breaker is faulty and does not trip. Thus, some embodiments of the present invention maintain the short for only about a half cycle of the 60 Hz AC current (about 8.3 milliseconds), or even less than a half cycle in some embodiments.

Additionally there is the apparent notion that a longer test (a longer duration of the short circuit) is better, while in actual fact, an efficient circuit interrupter will respond in less than the specified trip timing parameters. This is because "instantaneous" is something of a misnomer. As shown in FIG. 4, although the circuit interrupter's sensing element may react and initiate tripping, for instance, during the first half cycle of the sine wave, the physical action of the tripped element moving from closed (shown in FIG. 4 by points A1, B1, and C1) to open (shown in FIG. 4 by points A2, B2, and C2) position may take several cycles without requiring concomitant exposure to the tripping current. As described on page 12 of Cooper Bussmann Bulletin EDP-2 *Selective Coordination of Overcurrent Protective Devices For Low Voltage Systems*, "Once a breaker unlatches, it will open. At the unlatching point, the process is irreversible." From the same publication on page 5, ". . . the unlatching time indicates the point at which the breaker senses an overcurrent in the instantaneous region and releases the latch holding the contacts. However, the fault current continues to flow through the breaker and the circuit to the point of fault until the contacts can physically separate and extinguish the arc. Once the unlatching mechanism has sensed an overcurrent and unlatched, the circuit breaker will open." Thus a longer testing period may not only be unnecessary, but lead to both inaccuracies in analyzing the results of the test and bring unnecessary stress on the interrupter, the test device and the wiring circuit's components.

Thus, as used herein, "instantaneous-trip function" means a trip function that includes no intentional or substantial time delay such as would be encountered in a thermal or overload-trip function. An instantaneous-trip function is typically triggered by an electromagnetic force, but could be sensed and triggered by a current sensor coupled to a microprocessor. An overload-trip function is typically triggered by a thermal sensor such as a bimetallic strip, but could also be sensed and triggered by a current sensor coupled to a microprocessor that would not trigger immediately, but would trigger if an overcurrent was maintained for a substantial number of cycles of the AC current being sensed.

In any case, a testing period that extends beyond the specified timing trip parameters of the circuit interrupter will not be testing whether the interrupter is functioning within the manufacturer's specifications.

Figure 5:
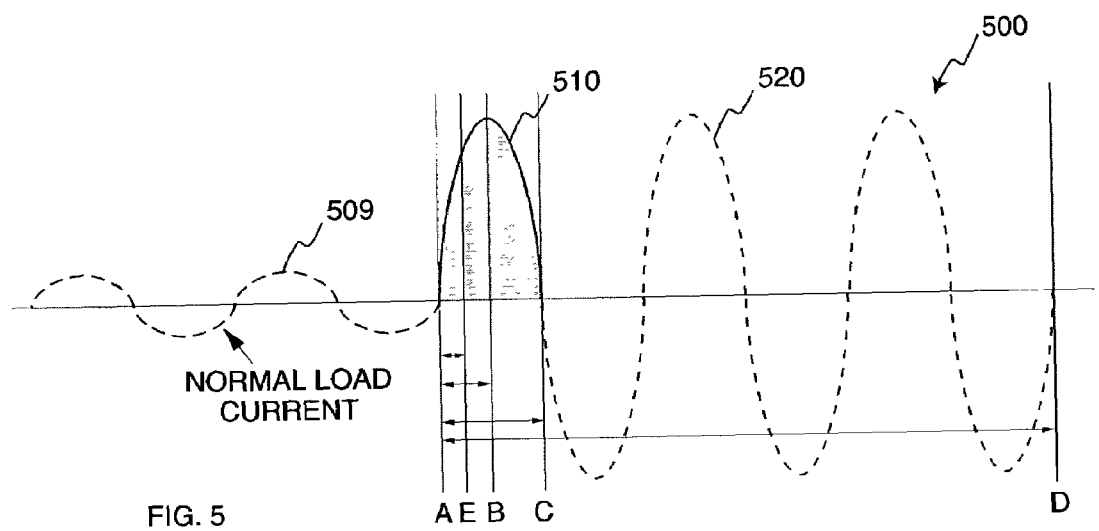
FIG. 5 is a graph showing several complete cycles of AC electricity with normal load current and current during an overload.

FIG. 5 graphically shows this principle in action. FIG. 5 is a graph 500 showing several complete cycles (509 and 520) of AC electricity with normal load current and current during an overload. The duration of short-circuit conduction is indicated by half cycle 510. At point A the overcurrent commences. Point B is the peak of the impressed current. At point C the current ceases. Sometime between points A and C unlatching is initiated. Sometime between points A and D, but subsequent to unlatching, the interrupter completes the tripping cycle. FIG. 5 shows that it is possible to apply the high "short" current for much less time than would be immediately apparent were one to judge by the total clearing time (in some embodiments, the specified clearing time of a circuit breaker being tested is three full cycles, or about 50 milliseconds).

Were the tester 101 to be turned on for the full three cycles, about six times as much power would go into heat in the tester 101 and in the wiring between the circuit breaker and the tester 101. Thus, by not turning on the SCR 110 after the first half cycle, a safer test is provided and less heat is generated. In other embodiments, the electronic switch (either SCR 110 or a triac or power MOSFET that is used in place of SCR 110) is triggered to conduct for more than one half cycle, but for less than or equal to the specified trip time of the circuit breaker-under-test, in order to reduce the heat generated as compared to a tester that conducted right up to the point that the circuit breaker opened.

In yet other embodiments, tester 101 is programmed to provide a short series of pulses (perhaps five, ten or twenty pulses, (or, in other embodiments, any suitably limited number of pulses) and thus an equivalent number of half cycles) that enable conduction by the shorting electronic switch for a period of time longer than the specified trip time, but for a time much shorter than would reliably be provided by a manually operated switch closure. Thus, in most cases the conduction would stop by the circuit breaker being tested opening. However, if the circuit breaker did not trip in its specified time, or longer, then tester 101 would stop conduction of the shorting circuit well before a fire or other catastrophe occurred. Even twenty pulses results in a short that lasts for only one third of a second.

In some embodiments, point A where the tester starts conducting the short-circuit current (as limited by resistor 120) is triggered at a time shortly after the zero crossing of the normal load current, in order that the SCR is reliably and consistently triggered. In some such embodiments, a time is selected approximately 0.5 millisecond (corresponding to about 20 volts) to 1 millisecond (corresponding to about 40 volts) after the zero crossing, in order that the voltage across the SCR is at least about 30 volts.

Figure 6:
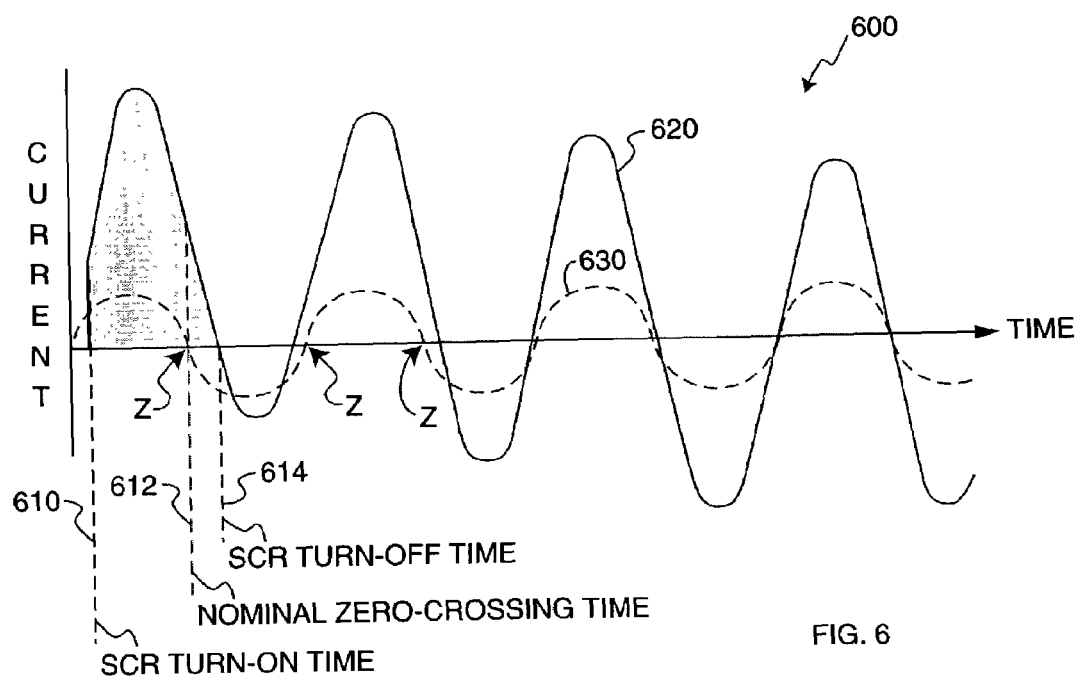

FIG. 6 shows a graph 600 of how the DC component of the 120VAC signal is sometimes skewed relative to zero volts by a strong short-circuit current. Dotted line 630 represents the rated load current, and the nominal zero crossing points Z, for a given circuit breaker. At time point 610, the SCR is turned on and a sharp current increase is seen, resulting in a DC shift of the subsequent current waveform. At time point 612, the normal zero crossing would have occurred, but for the DC skew that was added, and thus SCR 110 will not turn off until time point 614, which is somewhat later, thus lengthening the time that the SCR 110 conducts and increasing the power and heat generated. In some embodiments, a longer time delay is provided for the onset of conduction point 610, thus providing a smaller fraction of a half-cycle conduction period.

Cooper Bussmann Bulletin EDP-1 Part 1 *A Simple Approach To Short Circuit Calculations* states on page 3, "Short circuit current normally takes on an asymmetrical characteristic during the first few cycles of duration. That is, it is offset about the zero axis, as indicated in its FIG. 1 (which corresponds to FIG. 6 in this document)." This initial heightened amplitude can be taken advantage of by a tester that has a testing period of only a few cycles. FIG. 6 also graphically shows how impressing the current of the first half of each sine wave's cycle will be utilizing the highest amplitude halves of the sine waves in the case of a short circuit. It is believed the same would be true of a high overcurrent situation, for instance, where 20- or 40-times the rated current is impressed.

Additionally, as the peak of the impressed current is the pertinent portion of the testing cycle insofar as activating the instantaneous tripping element, it becomes important to ensure that this peak is part of the testing period. One method of ensuring this is to have a timer that operates relative to the actual cycles of the AC power sine wave. The device of the present invention does this.

Another overlooked aspect of testing instantaneous circuit interrupters is that they are designed to trip when the current is above a specified current level. Thus creating a true short circuit is not necessary.

FIG. 4 shows examples of overcurrents of, among others, 20-, 30- and 40-times the rating of the interrupter that results in unlatching times of less than 0.007 seconds, which is less than ½ cycle of 60-Hz AC power. A true short circuit can have undesirable side effects, for instance, by placing unnecessary stress on the testing device switching element. Additionally, by impressing an unnecessarily high current flow upon the interrupter the test will not indicate if the interrupter is operating within actual specified parameters.

An optimum test of the circuit interrupter is one that minimizes the exposure of the interrupter, its circuit and the testing device to high currents while performing a test that will accurately reflect the specified parameters of the instantaneous circuit interrupter.

The device of the present invention meets these testing requirements by presenting a tester that includes a timer which is activated both relative to the zero-cross of the sine wave and is on for periods relative to actual cycles of AC power, optionally being on only during one half of that AC power's sine wave. It also includes means for limiting the amplitude of the current peak.

A further embodiment of the present invention includes a circuit for limiting the on time of the testing period to specified time lengths relative to AC sine wave cycles. Circuits for timing electronic circuits relative to AC sine wave cycles are well known, as, for example, in digital clocks that use the AC sine wave as a clocking source. In the case of the device of the present invention such a timing method can be used to limit the test's timing length to multiples of AC sine waves counted by the tester's timing circuit as charted in FIG. 5.

Figure 7:
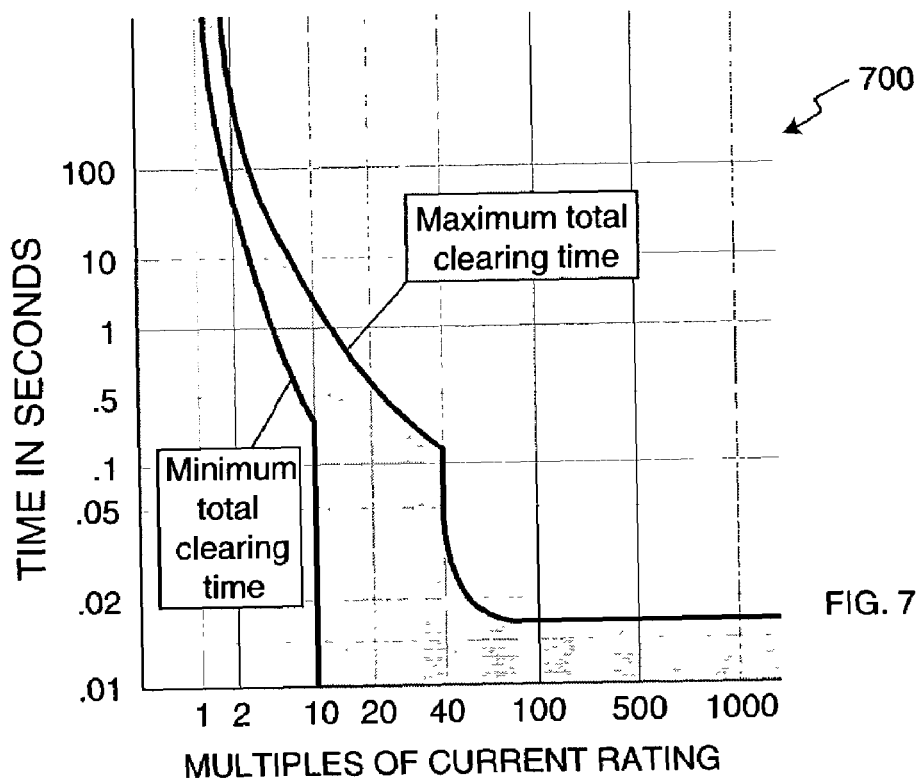
FIG. 7 is a log-log graph of tripping time in seconds verses multiples of current rating of a circuit breaker.
Figure 8:
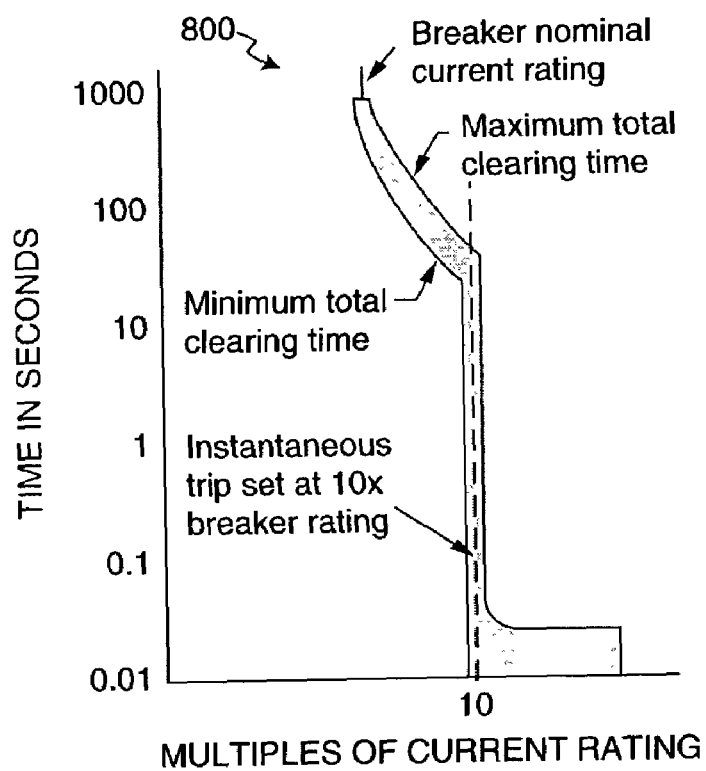
FIG. 8 is a log-log graph of tripping time in seconds verses multiples of current rating.

FIG. 7 is a log-log graph 700 of tripping time in seconds verses multiples of current rating of a circuit breaker. FIG. 8 is a log-log graph 800 of tripping time in seconds verses multiples of current rating. These are discussed further below.

Referring now to FIG. 9, the timing circuit is considered as a whole by numeral 130. Timing circuit 130 controls switching transistors Q1 and Q2, which in turn control the larger SCR 110 which is in series with load 120. In other words, the output of the timing circuit 130 turns on NPN transistor Q1, which turns on PNP transistor Q2 which in turn triggers SCR 110 via the resistor R5 and resistor R9 gating circuit. The momentary current surge is limited by the resistance load 120.

In some embodiments, control circuit 130 includes a programmable microcontroller U1 (such as a PIC12C508 microcontroller from Microchip Technology Incorporated of Chandler Ariz.) programmed to receive a stimulation indication from switch 132 (formed of SW1 and R10), and to receive a zero crossing indication from R8 and C6. Optional switch SW3 (with R11 and R12) encodes a cycle-selection indication, allowing the user to select a number of pulses to be generated. In some embodiments, controller U1 provides an active-low drive signal for LED D5 connected to R13, turning on the LED when the circuit is ready to be triggered. The LED turns off once the circuit breaker being tested opens. Controller U1 outputs one or more gate pulses from its pin 5, driving NPN transistor Q1 through R7. When Q1 turns on, it pulls the base of PNP transistor Q2 low (via resistors R4 and R6), turning it on, and providing an output pulse to SW2 of almost 5 volts (less the saturation voltage of Q2). Switch SW2 is selectable to activate SCR 110 (through resistor divider R5 and R9, where R9 normally keeps SCR 110 turned off) or triac 150 (through resistor divider R14 and R18, where R18 normally keeps triac 150 turned off).

The operation of circuit 900 of FIG. 9 is otherwise as described for circuit 101 of FIG. 1B.

To assist a person skilled in the art of electronics, a somewhat detailed specification of power supply 140 is offered herewith: 120-VAC line voltage is converted to five volts DC in the power supply 140. The power supply converts the high voltage to 5 volts by transferring the charge from a small capacitor (C1) to a larger one (C5 and C7 and C4) via diodes D1, D2 and D3. This type of power supply doesn't need a dropping resistor or transformer. In the power supply, a resistor (R8) drops the AC voltage to a safe level for input to a microcontroller to detect when the AC line crosses zero volts. In some embodiments, the protective diodes on the inputs of the microcontroller prevents the voltage from going above or below the power supply rails.

When the push button (SWI) is pressed, the microcontroller (U1) firmware waits for a low to high zero crossing then, after a short delay, outputs a pulse to fire either SCR 110 or triac 150, based on the position of switch 136. The short delay allows time for the AC line to reach a voltage high enough (e.g., approximately 30 volts, in some embodiments) so the SCR (thyristor) 110 can reach its holding current. This process is repeated on the high to low zero crossing to provide a second pulse in the second half of the first cycle, so the triac can fire on both halves of the AC cycle, although the SCR essentially ignores the second pulse since it is a uni-direction switch. In some embodiments, controller 130 provides three pulses in three consecutive half cycles, wherein triac 150 conducts during all three half cycles (a negative-going, a positive-going, and a negative-going half cycle) if switch 136 is in the GFCI-testing position, and SCR 110 conducts only during the middle half cycle (the positive-going half cycle) triggered by the second of the three pulses, since it conducts only for the positive half of the cycle.

Note: The internal common is connected to the hot wire of the 120-volt AC line, so the positive half cycle as seen by SCR 110 is when the input HOT line is negative relative to the neutral line.

Note: Optional switch SW4 is provided to connect the neutral and ground wires together at the tester, thus halving the resistance that is otherwise provided by the neutral wire alone, thus lowering the resistance of the overall circuit and reducing heat in those wires.

When the switch is in the triac position, the current from the trigger pulse is directed to the triac gate. The triac latches on because the current through R17 is above the holding current. R17 provides the test current for a GFCI breaker. For a single AC cycle current flows from hot to safety ground, which should trip a good breaker.

When the switch is in the SCR (circuit-breaker-test) position, the current from the trigger pulse is directed to the SCR gate. The SCR latches on for one-half cycle of the AC line, driving current between hot and neutral through the load. Since SCRs can only conduct in one direction, the high to low zero crossing pulse does not fire the SCR. The load is a small enough resistance so the current between hot and neutral will trip a good circuit breaker.

Multiple numbers of trigger pulses can be selected with selector switch (SW3). Obviously, the microcontroller can be programmed for variations of numbers of pulses and placement of pulses at desired points in the sine wave relative to the zero crossing.

Figure 10:
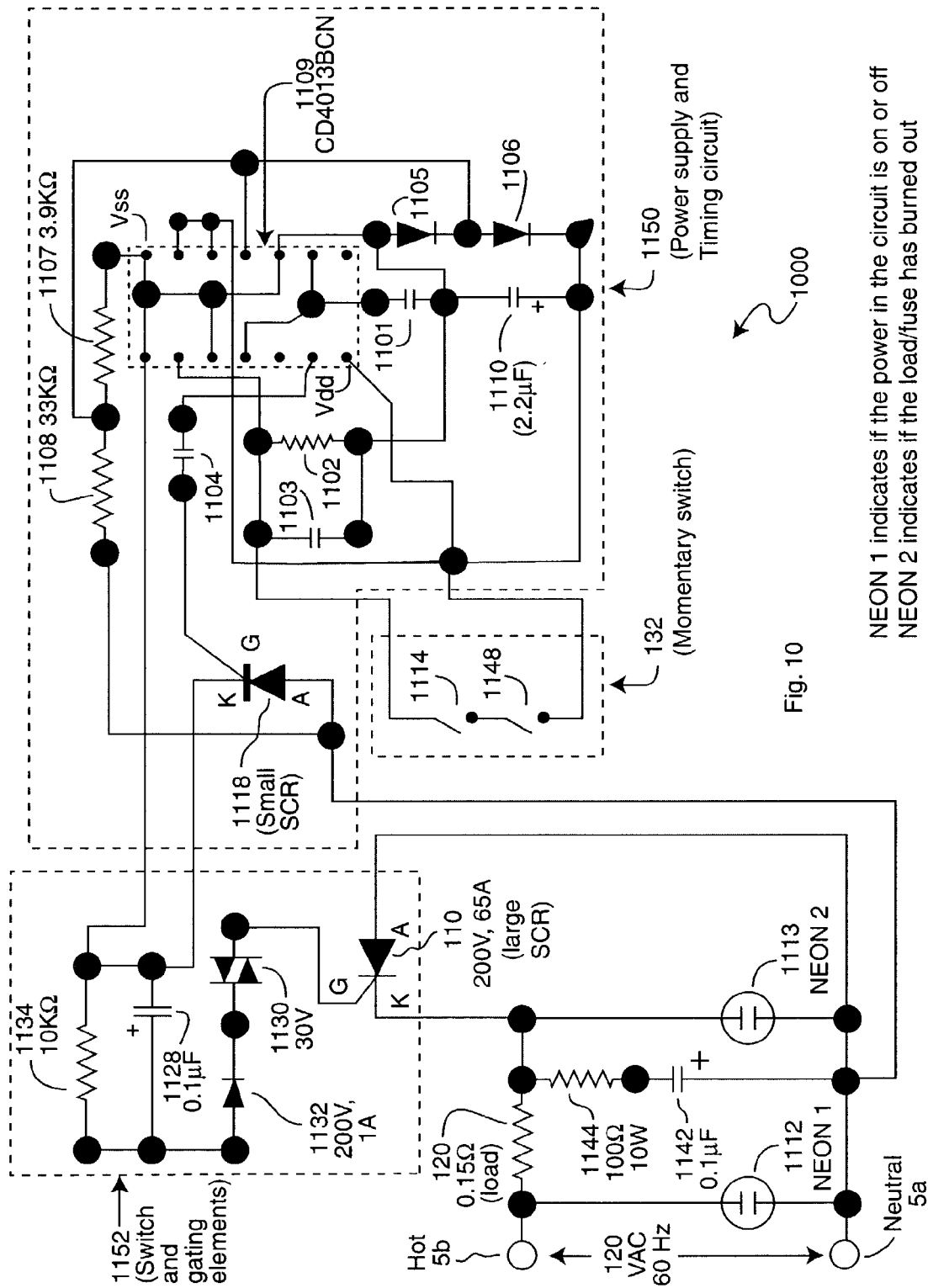
FIG. 10 is a wiring diagram of another embodiment of the device.

FIG. 10 is a wiring diagram of a tester device circuit 1000 of another embodiment of the device. Dotted block 1152 indicates the switch and gating elements. Dotted block 1150 indicates the power supply and timing circuit. Dotted block 132 indicates the two series-connected activation switches. The rest of the circuit is explained below.

Figure 11:
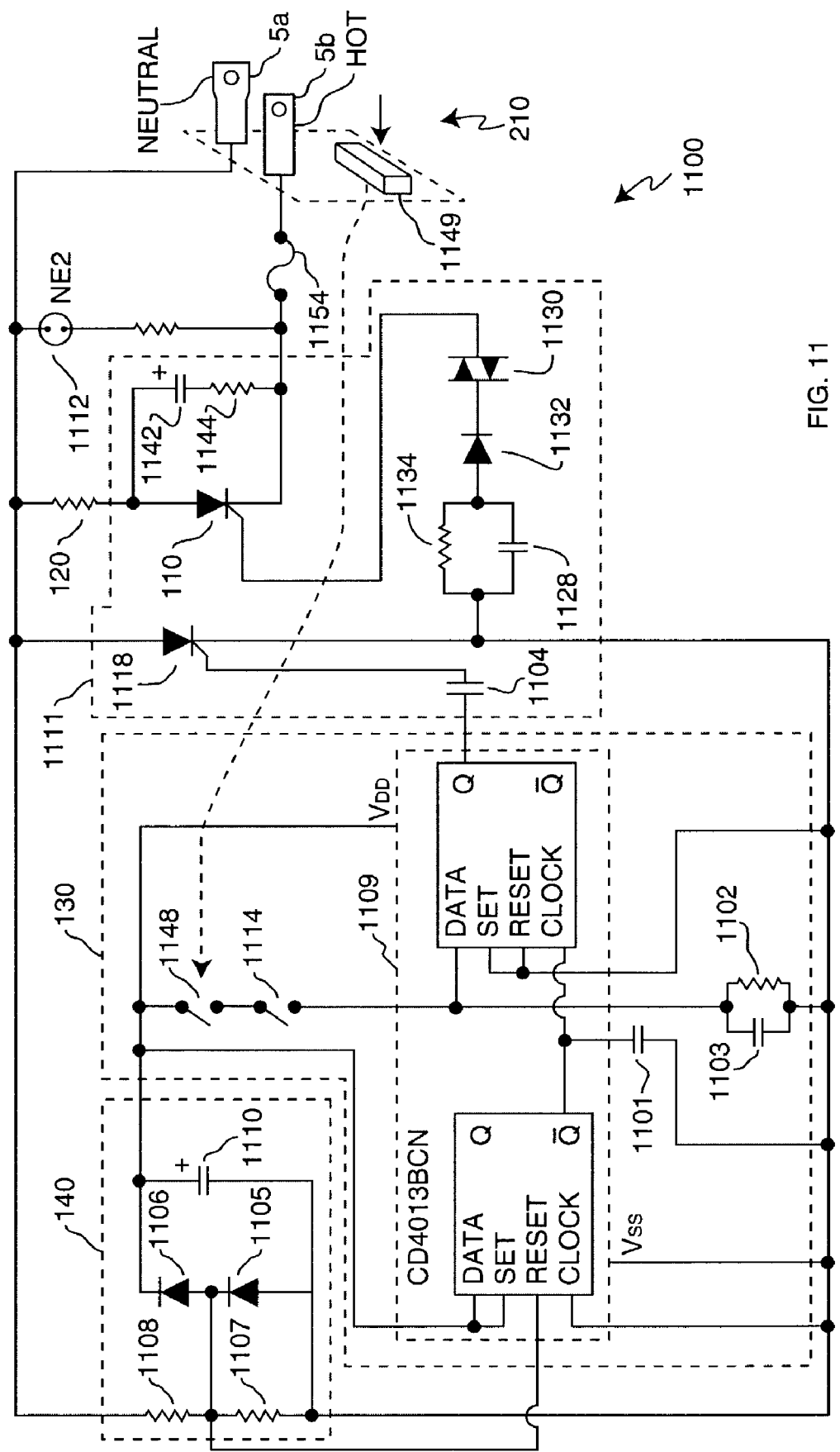
FIG. 11 is a circuit diagram of the device of FIG. 10.

FIG. 11 is a circuit diagram 1100 of the device of FIG. 10. In some embodiments, the plug 210 includes neutral prong 5a and hot prong 5b, as well as button 1149 that closes switch 1148 when it is pressed by the act of plugging device 1100 into an outlet. The circuit components and values used for some embodiments are set forth below.

For example, for household circuit breakers that are 120-volts AC and 20 amps or less, the following values will provide a very durable setup, used for some embodiments. Two prong plug 210 suitable for standard 120-volts AC outlet, a neon light 1112 with appropriate series resistor, momentary switch 1114 (used to activate the test function), SCR 110 rated for 200-volts AC/65 amps, 0.1-mF capacitor 1128, 32-volt diac 1130, 200-volt, 1-amp diode 1132, 10K-ohm ½-watt resistor 1134, 0.15-ohm 50-watt resistor 120. A 0.1-mF capacitor 1142 and a 100-ohm ½-watt resistor 1144 form a "snubber" that can aid in protecting the SCR by absorbing momentary current surges during shutoff or connecting/disconnecting to the circuit 300 (see FIG. 3). Means, such as a heat sink, are, in some embodiments, provided to conduct away and dissipate heat from the SCR 110 and load resistor 120. Wires in device 1100 that are carrying the high amperage current are a gauge sufficient to carry the current the particular circuit breaker will require to trip.

There are various possibilities with regard to the resistance and wattage of load 120 that can be varied depending on the limitations of the chosen switching element and the amplitude and duration of the current tripping requirements of and the current supply to the circuit breaker in question. Note that the resistor load may be eliminated depending on the current limitations of the switching element.

Although the circuit of FIG. 11 is considered to be one embodiment, other alternate embodiments are possible. In particular these embodiments envision different timing circuits, switching devices, gating or on/off circuits and incorporated safety features.

It will be understood that although an SCR 1110 is shown as the switching device in electronic switch 110, that is, an SCR 1110 has been shown in the circuit to perform a switching function, other alternative switching devices, such as an MCT (MOS-controlled thyristor), a triac, a power MOSFET, or other high-current semiconductor device could be used, with appropriate gating circuits or physical control mechanisms. Such switching elements can be paralleled to carry higher currents.

FIG. 11 also shows momentary switch 1148 (a switch that is activated when tester is inserted into its receptacle) in series with switch 1114 (which is manually activated to initiate the test). Switch 1148 helps prevent accidental activation (e.g., if switch 1114 is depressed while inserting the tester into an outlet) and prevent arcing between the plug and the outlet by not allowing turn on until the plug is completely seated (which then closes switch 1148). This arcing could occur in the absence of switch 1148 if the user held momentary switch 1114 closed as the device was inserted into the receptacle. It will be understood by those skilled in the art that this feature could be located elsewhere in the circuit of the device. This is illustrated in FIG. 11 with switch button 1149 (which closes switch 1148) located between the terminals of plug 210.

In some embodiments, controller circuit 130 includes a CMOS latch pair 1109 of type CD4013BCN, wired as shown with capacitor 1101 connected between output not-Q1 and ground, that, when activated by the closing of both switch 1148 and switch 1114 (connected to resistor 1102 and capacitor 1103 which are also connected to the internal signal ground Vss), produces a single pulse through capacitor 1104 to activate small SCR 1118, through RC pair 1134 and 1128, diode 1132, and DIAC 1130 then activates SCR 1110 to turn on a half-cycle current pulse limited by load resistor 120.

Resistors 1108 and 1107, diodes 1105 and 1106, and capacitor 1110 form power supply 140.

In some embodiments, a neon light 1112 (with appropriate internal limiting resistor) indicates when power is on power contacts 5a and 5b; and neon light 1113 (with appropriate internal limiting resistor) indicates when power is on internally (i.e., when external power is applied power contacts 5a and 5b and resistor/fuse 120 is not open (the fuse blown).

Further, the load resistor 120 can act as a fuse in addition to, or in place of, fusible link 1154 in order to provide protection in the event the circuit breaker 338 (FIG. 3) does not function correctly. As this is a cascade arrangement of circuit protection, there will have to be a coordination between load resistor 120 fusible link 1154 and breaker 338. In other words, the rating of the fusible link within the device of this disclosure should be such that it will not open before circuit breaker 338 but such that it will open before the existing circuit or the device of this disclosure can be damaged. It will be understood by those skilled in the art that this feature could be located elsewhere in the circuit of the device.

There are many standard variations on this circuit. For instance, there are many different circuits of components for gating semiconductors that are commonly known to those skilled in the art of electronics. Additionally, the microcontroller of the preferred embodiment of this disclosure provides a delay after connection to power to allow the plug to be fully seated before use and a delay after cycling the test to allow device components time to cool and to protect the circuit interrupter and its associated circuit components. Such a circuit could provide a brief delay before allowing activation of the circuit, substituting for momentary switch 1148 that was described earlier in this disclosure. In fact, in some embodiments with such a delay, both switches 1114 and 1148 are eliminated, and the microcontroller is programmed with many variations of delays, including one where the device would be plugged in and then function automatically after the delay interval. Also, the microcontroller can be programmed to deliver a pattern of gating pulses, for instance, a single pulse, followed by a delay and then another pulse.

The disadvantage of using a mechanical switch is that its contacts are subject to wear, fusing, pitting and the action of a mechanical switch is necessarily slower and less accurate as compared with a solid state switching element. As the switching time of a semiconductor can be very exactly controlled, the preferred embodiment of this device is with a semiconductor circuit as the "switch." As there are many different semiconductors available, again the choice of which to use is a question of current requirements and cost.

Although the preferred embodiment includes an on-time of one half cycle of AC power, it is understood that other lengths of on-time can be utilized. It is especially emphasized that by using the AC sine wave as a clock signal, as shown in FIG. 5, a timer can be set to be on for integer multiples of the AC sine wave, or for ½ multiples of the sine wave, or for other predetermined time lengths. Since circuit breakers have different ratings, one can then set the tester to lengths of time meaningful relative to the specifications of a specific circuit breaker.

Additionally, by measuring the amperage of the initial cycle of operation, one can deduce the impedance of the circuit of the circuit breaker. If the impedance is large enough (i.e., the amperage of the initial test is small enough), the resistance element of the tester can be switched out of the circuit and a subsequent test can be performed utilizing just the resistance of the circuit of the circuit breaker. It is also possible to have multiple resistance elements that the user could choose between to enable tests of different resulting amperage. These variations are well known to those knowledgeable in the art.

Also, it is a simple adaptation to have the resistance connect between the hot and ground wires to test other kinds of circuit breakers, such as a ground fault interrupter, by use of a suitably sized resistance and length of on-time. This is shown in FIG. 9 where the triac connects hot to ground via resistor R17. Thus the device of this disclosure can be used to test multiple types of circuit interrupters. It is also possible to selectively test breakers by selecting which outlet wires to test. In other words, given a circuit with multiple breakers arranged in a cascade arrangement, one can test only a panel's circuit breaker, or only a ground fault interrupter (which could be, for instance, downstream from the panel's breaker as shown in FIG. 3), leaving the other breaker still in an on position or setting. The tester could have two buttons, one for each type of breaker test, or a switch to choose between the various tests.

Additionally, there are numerous circuit finders in existence that utilize a transmitter plugged into an outlet and a receiver or sensor at the circuit breaker panel. An electrical circuit finder has a transmitter that is plugged into one of the circuits of a building's electrical system and a receiver that is used to identify other elements of the circuit such as a circuit breaker, fuse, switch, electrical device or outlet. By combining a circuit finder with the circuit tester (the device of the present disclosure) one could first test the circuit breaker and, if the breaker were in working order, it would trip. If the breaker did not trip, then one could use the circuit finder to determine which breaker to turn off manually.

Also, a noise maker, such as a piezo buzzer, could be incorporated into the device of this disclosure to allow locating an outlet by the old method of flipping breakers off until the noise stops.

Also, although the device of this disclosure utilizes an LED to indicate that the circuit is live, it will be obvious that other indicators, such as a neon light, buzzer or vibrator could be included to do this.

Operation

Figure 12:
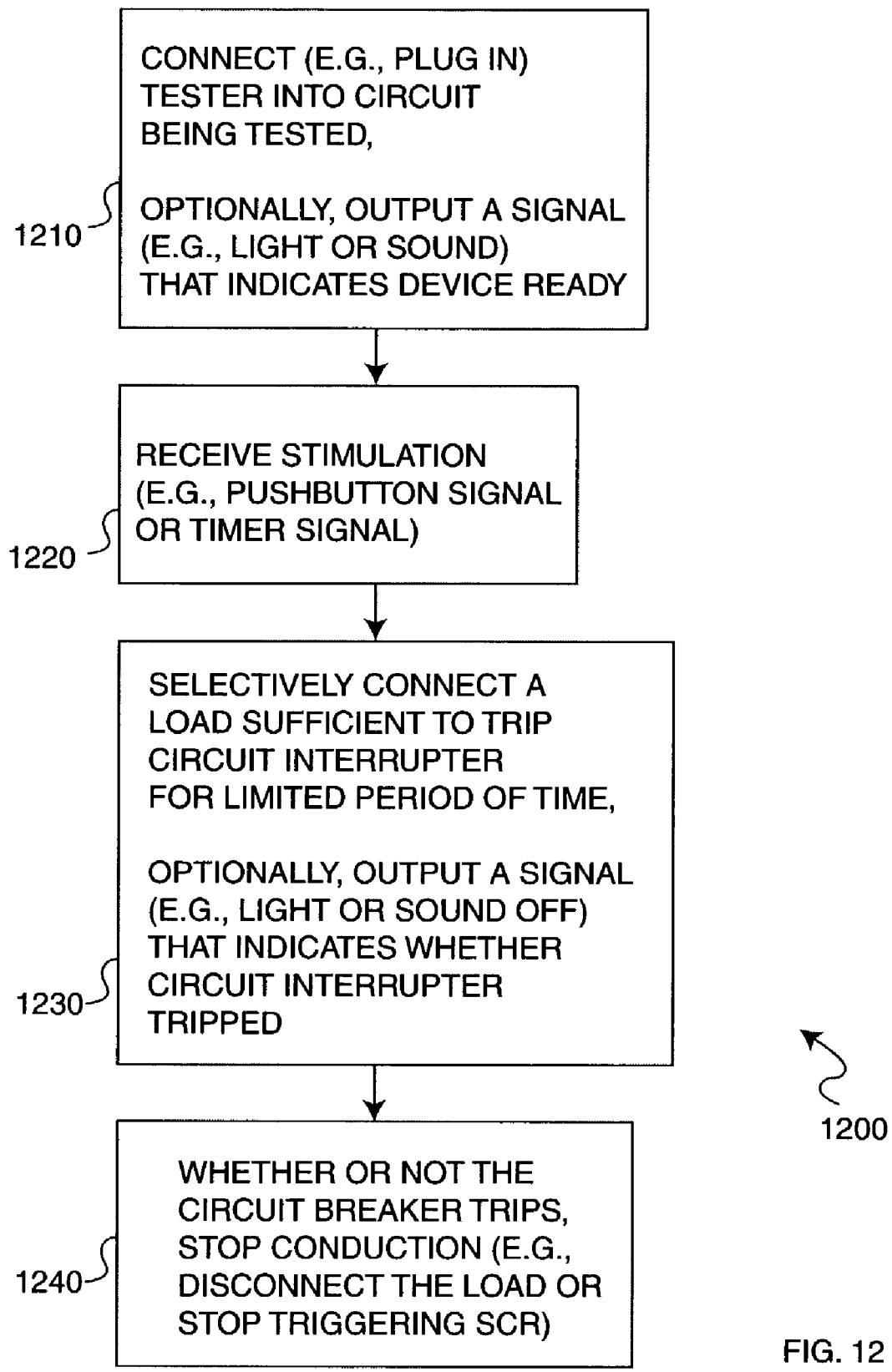
FIG. 12 is a flow chart showing the operation of the invention.

FIG. 12 is a flow chart 1200 of the operation of some embodiments of the invention. At block 1210, the tester is connected to the circuit being tested (e.g., a household wiring circuit 300 protected by a circuit interrupter 338. In some embodiments, the circuit-interrupter includes an overload-trip function and an instantaneous-trip function. In some embodiments, a signal (such as a small light indicator or a sound indicator (e.g., a beeper or a voice synthesizer) is output that indicates the tester is ready to perform the test. At block 1220, the tester receives a stimulation indication (for example, a user presses a "test" button, or a timer pulse is received after a predetermined amount of time after the tester is connected). At block 1230, the tester selectively connects an electrical load to wires connected to the circuit interrupter based on the reception of the stimulation indication, wherein the electrical load is sufficient to trigger the instantaneous-trip function of the circuit-interrupter. In some embodiments, a signal (or lack thereof), such as a light or beeper turning off or a voice synthesizer that indicates failure due to the power still being applied, indicates the success or failure of the circuit breaker to trip as specified.

In some embodiments of the method, the selectively connecting (block 1230) includes connecting the electrical load to the circuit-interrupter for a time no greater than a pre-specified maximum trip time of the instantaneous-trip function. In some embodiments of the method, the pre-specified maximum trip time of the instantaneous-trip function is three cycles of AC power. In some embodiments of the method, the selectively connecting includes connecting the electrical load to the circuit-interrupter for a time no greater than about one-half cycle of AC power. In some embodiments of the method, the selectively connecting includes providing an enabling control signal pulse to an SCR at a point in time (e.g., delayed slightly from the zero-crossing of the AC signal) when an electrical load on the electronic switch is at least about 30 volts.

Some embodiments of the method further include stopping electrical conduction (block 1240) in the electrical load as a result of a failure of the selectively connecting to stop conduction.

The operation of one embodiment of the device of this disclosure permits the user to: (1) determine if the outlet is live, (2) to turn off the power to that outlet, and (3) to see that the power is off, all from the location where the user wishes to work.

A compact housing a few inches in each dimension is simply plugged into the outlet. A light indicates if the power is on. Depressing a button allows a brief surge of current that causes the circuit interrupter to trip off. The light turns off indicating the power is now off. In some embodiments, all of this is done at the outlet to be worked on.

If the circuit breaker is faulty and will not flip to the off position, the indicator light will show the circuit is still live.

The current surge has a duration of only a fraction of a second and the amplitude of the current surge is limited. This means that minimal stress is presented to the device, the outlet, the wiring in the circuit and the circuit breaker of the circuit.

Further, with minor modifications (for example, different plug shapes for different style outlets or simply probes connected to circuit 900 of FIG. 9), it can be adapted for use in a wide variety of situations including standard receptacles (see FIG. 2A), light bulb receptacles (see FIG. 2B) or bare wires (see FIG. 9). Similarly, the device can be constructed to be used with a variety of voltages and currents.

In order to design and build an optimum circuit breaker locator, it is necessary to give a brief explanation of the mechanism and operation of circuit breakers and fuses.

Fuses and breakers operate in fundamentally different manners in the case of short circuits. Fuses are thermal devices. When there is a short circuit an element in the fuse heats up and melts. However, in the case of a short circuit a circuit breaker senses a magnetic wave that exceeds some threshold value (i.e., caused by the excess current of the short circuit). This wave causes the breaker to trip. Referring now to FIG. 5, one sees that a fuse is designed to blow early in the first half cycle of the AC surge, as illustrated by line AE, while a circuit breaker takes between one-half and three cycles to trip, as illustrated by lines AB and AD. Thus the fuse would usually blow before the circuit breaker even initiates its tripping cycle.

In experiments with a prototype of the device of this disclosure, It has been found that a large current surge of a half cycle of AC is sufficient to cause a circuit breaker to trip, although the mechanical, physical action may take longer. The desirable aspect of this is that the shorter the duration of the current surge, proportionately less heat is created.

Referring now to FIG. 7, one sees a log-log graph wherein the amperage of the load, overload or short circuit is compared with the circuit breaker's clearing time, or the time it takes to trip. The vertical axis is the clearing time in seconds, and the horizontal axis is the multiple of the current rating of the circuit breaker. For example, if there is a 40-ampere load on a 20-ampere circuit breaker, the multiple of current rating would be two and the clearing time would be between approximately 15 and 100 seconds.

If one is dealing with a 15-ampere breaker in a panel that is in turn protected by a 100-ampere breaker, with a 600-ampere current, the 15-ampere breaker will experience a forty times its current rating current and trip nearly instantaneously, while the 100-ampere breaker will have only a six times current rating multiple current and not trip for between approximately 0.8 and 6 seconds. Thus, one can trip the single 15-ampere breaker and not the 100-ampere breaker which are in a series relationship.

Molded case circuit breakers (MCBs) with both thermal and magnetic trips account for 90–95% of circuit breakers presently in use, and for at least 80% of those now being specified. As the name implies, a thermal-magnetic trip unit has two separate overcurrent tripping devices or elements. One is a bimetallic thermal element, that responds to the heating effect of the current through the MCB. This element establishes the continuous current rating and provides time-delay overcurrent protection up to ten times breaker continuous rating. The other tripping device is an "instantaneous" magnetic element that responds to the magnetic field produced by current through the MCB. It is basically a solenoid, which unlatches "instantly" once current exceeds pick-up (trip) setting.

In smaller breakers, the instantaneous trip unit pick-up setting is fixed, usually at ten times continuous current rating.

"The time-current characteristics for typical 100-amp MCB are shown in FIG. 8. Other amperage breaker's ratings are similar.

Note that the time-current characteristics are shown as a band. This indicates the minimum and maximum tripping time resulting from breaker manufacturing tolerances. Values of time-current to the left of the band should not cause the breaker to open. Values of time-current to the right of the band should always cause the breaker to open. While values that fall within the band may or may not open the breaker.

Note the part of the band labeled instantaneous trip. The pick-up setting is approximately 1000 amperes that lies in the center of the band. Since this portion of the band is vertical, it indicates that the trip element will unlatch the breaker for any value of current that exceeds the maximum tolerance, and may unlatch it for any value of current that exceeds the minimum tolerance. The unlatching time is extremely fast. In some cases as little as 0.0001 seconds.

However, the breaker does not clear the circuit that fast. It requires time for the parts to move after the breaker is unlatched. The opening or clearing time is indicated by the horizontal (or nearly horizontal portion of the curve. The total clearing times for thermal-magnetic MCB range from about ¾ cycle for very small MCB to about two cycles or more for the largest MCB." [From Littlefuse Basic Terminology pg 77 & 79]

There is little advantage in generating an amperage greater than forty times the current rating of the breaker insofar as shortening the clearing time. This is especially clear as shown in FIG. 4.

By generating a limited high peak current of limited duration one can design and build an optimum instantaneous circuit interrupter testing device. There are many well known means, including, but not limited to, microcontrollers, one-shot timing circuits, flashers and sequential timers, for limiting the on-time and delay before or after usage.

Aside from the timing means utilized, the designer must take into account:
  a. the current rating of the breakers to be tripped that will determine the amplitude of current desired;
  b. the duration of current required;
  c. the SOA (safe operating area) of the chosen switching element concerning current amplitude and duration of said current;
  d. the electrical current supply available; and
  e. the cost of parts.

Of these, there are two main limitations the designer must take into account. First, each switching element has limitations as to the peak current it can safely switch for a given duration of time, commonly known as the safe operating area or SOA. Second, the cost of parts and their associated gating elements. In the case of the preferred embodiment of the present invention, an SCR has been used for instantaneously tripping a circuit breaker as SCRs are generally relatively inexpensive for the overcurrent levels they can switch reliably. Additionally, an SCR conducts for only one half of the AC sine wave, incurring less stress on the device and the components of the circuit to be tested.

In some embodiments, a small triac is used for the GFCI-testing portion of the device because it can conduct on both halves of the AC sine wave. The small currents generated in the test present no heating problems so there is no additional stress to any components.

Conclusion

The present invention provides a simple and effective way to test the instantaneous-trip function of a circuit-interrupter. One aspect of the invention provides a tester for a circuit-interrupter, wherein the circuit-interrupter includes an overload-trip function and an instantaneous-trip function. This tester includes an electrical plug having a first external electrical connector and a second external electrical connector, a control circuit that outputs a control signal, an electronic switch selectively enabled by the control signal, and an electrical load connected to the electronic switch such that the electronic switch connects the electrical load to the first external electrical connector and the second external electrical connector as controlled by the control signal, wherein the electrical load is sufficient to trigger the instantaneous-trip function of the circuit-interrupter.

In some embodiments, the circuit-interrupter has both an overload-trip function and an instantaneous-trip function, and the tester trips only the instantaneous-trip function.

In some embodiments of the tester, the control signal enables the electronic switch to conduct limited to a time no greater than a pre-specified maximum trip time of the instantaneous-trip function.

In some embodiments, the pre-specified maximum trip time of the instantaneous-trip function is three cycles of AC power. In some such embodiments, the electronic switch is enabled to conduct for a time no greater than about one-half cycle of AC power.

In some embodiments of the tester (whether or not the maximum trip time is specified as three cycles), the electronic switch is enabled to conduct for a time no greater than about one-half cycle of AC power.

In some embodiments, the electrical load acts as a fuse that opens as a result of failure of the electronic switch to stop conduction.

In some embodiments, the electronic switch includes a silicon-controlled rectifier (SCR), and the control circuit provides an enabling control signal pulse to the SCR at a point in time when an electrical load on the SCR is about 30 volts. In some such embodiments, the electronic switch is enabled to conduct for a time no greater than about one-half cycle of AC power.

In some embodiments, the control circuit includes a programmable controller.

Some embodiments further include a ground fault tester circuit that comprises a small current load selectively coupled between the first external electrical connector of the plug and a third external electrical connector of the plug.

Some embodiments further include a manually activated switch coupled to the control circuit, wherein the switch initiates output of the control signal.

Another aspect of the present invention provides a method of testing a circuit-interrupter, wherein the circuit-interrupter includes an overload-trip function and an instantaneous-trip function. This method includes receiving a stimulation indication, and selectively connecting an electrical load to wires connected to the circuit interrupter based on the reception of the stimulation indication, wherein the electrical load is sufficient to trigger the instantaneous-trip function of the circuit-interrupter.

In some embodiments of the method, the selectively connecting includes connecting the electrical load to the circuit-interrupter for a time no greater than a pre-specified maximum trip time of the instantaneous-trip function.

In some embodiments of the method, the pre-specified maximum trip time of the instantaneous-trip function is three cycles of AC power.

In some embodiments of the method, the selectively connecting includes connecting the electrical load to the circuit-interrupter for a time no greater than about one-half cycle of AC power.

Some embodiments of the method further include stopping electrical conduction in the electrical load as a result of a failure of the selectively connecting to stop conduction.

In some embodiments of the method, the selectively connecting includes providing an enabling control signal pulse to an SCR at a point in time when an electrical load on the SCR is about 30 volts.

Yet another aspect of the present invention provides a tester for a circuit-interrupter, wherein the circuit-interrupter includes an overload-trip function and an instantaneous-trip function. This tester includes an electrical plug having a first external electrical connector and a second external electrical connector, and means as described herein for selectively connecting an electrical load to the first external electrical connector and the second external electrical connector, both being connected to the circuit interrupter, wherein the electrical load is sufficient to trigger the instantaneous-trip function of the circuit-interrupter. In some embodiments of this tester, the circuit-interrupter has both an overload-trip function and an instantaneous-trip function, and the tester trips only the instantaneous-trip function.

In some embodiments of such a tester, the means for selectively connecting includes means for connecting the electrical load to the circuit-interrupter for a time no greater than a pre-specified maximum trip time of the instantaneous-trip function. In some embodiments of such a tester, the pre-specified maximum trip time of the instantaneous-trip function is about three cycles of AC power, and the electronic switch is enabled to conduct for a time no greater than about one-half cycle of AC power.

Still another aspect of the invention provides a tester for a circuit-interrupter. This tester includes an electrical connection having a first external electrical connector and a second external electrical connector, a control circuit that outputs a control signal, and a first electronic switch selectively enabled by the control signal such that the electronic switch conducts an overcurrent between the first external electrical connector and the second external electrical connector and then stops conducting at a point in time before the circuit-interrupter opens its circuit.

In some embodiments of this tester, the circuit-interrupter includes an instantaneous-trip function, and wherein the electronic switch conducts an overcurrent between the first external electrical connector and the second external electrical connector and then stops conducting at a point in time before the instantaneous-trip function of the circuit-interrupter opens its circuit. In some such embodiments, the circuit-interrupter also includes an overload-trip function, and the tester trips the instantaneous-trip function of the circuit-interrupter but not the overload-trip function of the circuit-interrupter.

In some embodiments of this tester, the electronic switch is enabled to conduct for a time no greater than about one-half cycle of AC power.

In some embodiments of this tester, the electronic switch includes a silicon-controlled rectifier (SCR), and the control circuit provides an enabling control signal pulse to the SCR at a point in time after a zero-crossing.

Some embodiments of this tester further include a ground fault tester circuit that comprises a small current load selectively coupled between the first external electrical connector of the plug and a third external electrical connector of the electrical connection.

In some embodiments of this tester, the overcurrent is limited by a resistance in the tester of about 0.15 ohms.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A tester for a circuit-interrupter, wherein the circuit-interrupter includes an overload-trip function and an instantaneous-trip function, the tester comprising:
   an electrical plug having a first external electrical connector and a second external electrical connector;
   a control circuit that outputs a control signal;
   an electronic switch selectively enabled by the control signal; and
   an electrical load connected to the electronic switch such that the electronic switch connects the electrical load to the first external electrical connector and the second external electrical connector as controlled by the control signal, wherein the electrical load is sufficient to trigger the instantaneous-trip function of the circuit-interrupter.

2. The tester of claim 1, wherein the control signal enables the electronic switch to conduct limited to a time no greater than a pre-specified maximum trip time of the instantaneous-trip function.

3. The tester of claim 2, wherein the pre-specified maximum trip time of the instantaneous-trip function is three cycles of AC power.

4. The tester of claim 3, wherein the electronic switch is enabled to conduct for a time no greater than about one-half cycle of AC power.

5. The tester of claim 1, wherein the electronic switch is enabled to conduct for a time no greater than about one-half cycle of AC power.

6. The tester of claim 1, wherein the electrical load acts as a fuse that opens as a result of failure of the electronic switch to stop conduction.

7. The tester of claim 1, wherein the control circuit includes a programmable controller.

8. The tester of claim 1, further comprising a ground fault tester circuit that comprises a small current load selectively coupled between the first external electrical connector of the plug and a third external electrical connector of the plug.

9. The tester of claim 1, further comprising a manually activated switch coupled to the control circuit, wherein the switch initiates output of the control signal.

10. A tester for a circuit-interrupter, wherein the circuit-interrupter includes an overload-trip function and an instantaneous-trip function, the tester comprising:
an electrical plug having a first external electrical connector and a second external electrical connector;
a control circuit that outputs a control signal;
an electronic switch selectively enabled by the control signal; and
an electrical load connected to the electronic switch such that the electronic switch connects the electrical load to the first external electrical connector and the second external electrical connector as controlled by the control signal, wherein the electrical load is sufficient to trigger the instantaneous-trip function of the circuit-interrupter; wherein the electronic switch includes a silicon-controlled rectifier (SCR), and the control circuit provides an enabling control signal pulse to the SCR at a point in time when an electrical load on the SCR is about 30 volts.

11. The tester of claim 10, wherein the electronic switch is enabled to conduct for a time no greater than about one-half cycle of AC power.

12. A method of testing a circuit-interrupter, wherein the circuit-interrupter includes an overload-trip function and an instantaneous-trip function, the method comprising:
providing a portable testing device that includes an electrical plug having a first external electrical connector and a second external electrical connector;
connecting the first and second external electrical connectors to a socket that is wired to a load side of the circuit interrupter; receiving a stimulation indication; and
selectively connecting an electrical load to first and second external electrical connectors connected to the wires connected to the load side of the circuit interrupter based on the reception of the stimulation indication, wherein the electrical load is sufficient to trigger the instantaneous-trip function of the circuit-interrupter.

13. The method of claim 12, wherein the selectively connecting includes connecting the electrical load to the circuit-interrupter for a time no greater than a pre-specified maximum trip time of the instantaneous-trip function.

14. The method of claim 13, wherein the pre-specified maximum trip time of the instantaneous-trip function is three cycles of AC power.

15. The method of claim 14, wherein the selectively connecting includes connecting the electrical load to the circuit-interrupter for a time no greater than about one-half cycle of AC power.

16. The method of claim 12, further comprising:
stopping electrical conduction in the electrical load as a result of a failure of the selectively connecting to stop conduction.

17. A method of testing a circuit-interrupter, wherein the circuit-interrupter includes an overload-trip function and an instantaneous-trip function, the method comprising:
providing an electrical plug having a first external electrical connector and a second external electrical connector that are connected by wires to the circuit interrupter; receiving a stimulation indication; and
selectively connecting an electrical load to the first and second external electrical connectors that are connected to the wires connected to the circuit interrupter based on the reception of the stimulation indication, wherein the electrical load is sufficient to trigger the instantaneous-trip function of the circuit-interrupter, wherein the selectively connecting includes providing an enabling control signal pulse to an SCR at a point in time when an electrical load on the SCR is about 30 volts.

18. A tester for a circuit-interrupter, wherein the circuit-interrupter includes an instantaneous-trip function, the tester comprising:
a portable testing device that includes an electrical plug having a first external electrical connector and a second external electrical connector, and
means for selectively connecting and disconnecting an electrical load to the first external electrical connector and the second external electrical connector, both being connected by wires that are connected to the load side of the circuit interrupter, and that are intended to be protected by the circuit interrupter, wherein the electrical load is sufficient to trigger the instantaneous-trip function of the circuit-interrupter.

19. The tester of claim 18, wherein the means for selectively connecting includes means for connecting the electrical load to the circuit-interrupter for a time no greater than a pre-specified maximum trip time of the instantaneous-trip function.

20. The tester of claim 19, wherein the pre-specified maximum trip time of the instantaneous-trip function is about three cycles of AC power, and the electronic switch is enabled to conduct for a time no greater than about one-half cycle of AC power.

21. A tester for a circuit-interrupter, the tester comprising:
an electrical connection having a first external electrical connector and a second external electrical connector;
a control circuit that outputs a control signal;
a first electronic switch selectively enabled by the control signal such that the electronic switch conducts an overcurrent between the first external electrical connector and the second external electrical connector and then stops conducting at a point in time before the circuit-interrupter opens its circuit.

22. The tester of claim 21, wherein the circuit-interrupter includes an instantaneous-trip function, and wherein the electronic switch conducts an overcurrent between the first external electrical connector and the second external electrical connector and then stops conducting at a point in time before the instantaneous-trip function of the circuit-interrupter opens its circuit.

23. The tester of claim 22, wherein the circuit-interrupter also includes an overload-trip function, and the tester trips the instantaneous-trip function of the circuit-interrupter but not the overload-trip function of the circuit-interrupter.

24. The tester of claim 21, wherein the electronic switch is enabled to conduct for a time no greater than about one-half cycle of AC power.

25. The tester of claim 21, wherein the electronic switch includes a silicon-controlled rectifier (SCR), and the control circuit provides an enabling control signal pulse to the SCR at a point in time after a zero-crossing.

26. The tester of claim 21, further comprising a ground fault tester circuit that comprises a small current load selectively coupled between the first external electrical connector of the plug and a third external electrical connector of the electrical connection.

27. The tester of claim 21, wherein the overcurrent is limited by a resistance in the tester of about 0.15 ohms.

28. The tester of claim 21, wherein the overload current is about ten times a continuous current rating of the circuit interrupter.

29. An apparatus comprising:
a an electrical connector adapted to be connected to a load-side circuit of a circuit interrupter;
a control circuit;
an electronic switch; and
an electrical load selectively connectable to the electrical connector by the electronic switch as controlled by the control circuit, wherein the electrical load causes an instantaneous trip current to be drawn through load-side circuit of the circuit interrupter, wherein the instantaneous trip current is sufficient to meet an instantaneous trip current specification of the circuit interrupter.

30. The apparatus of claim 29, wherein the control circuit enables the electronic switch to conduct limited to a time no greater than a pre-specified maximum trip time of the instantaneous-trip function.

31. The apparatus of claim 29, wherein the control circuit enables the electronic switch to conduct limited to a time no greater than three cycles of AC power.

32. The apparatus of claim 29, wherein the control circuit enables the electronic switch to conduct limited to a time no greater about one-half cycle of AC power.

33. The apparatus of claim 29, wherein the electrical load acts as a fuse that opens as a result of failure of the electronic switch to stop conduction.

34. The apparatus of claim 29, wherein the electronic switch includes a silicon-controlled rectifier (SCR), and the control circuit provides an enabling control signal pulse to the SCR at a point in time shortly after a zero-crossing, in order that the SCR is reliably and consistently triggered.

35. A device for testing an instantaneous-trip function of a circuit interrupter having a designated fault current rating which is supplied with a certain line voltage, with the instantaneous-trip function being responsive to an overload condition on the load-side of the circuit interrupter where the line voltage and the resistance of the load-side circuit of the circuit interrupter affects the quantity of current available for tripping the circuit interrupter, the tester comprising:
connectors adapted to connect with the load-side circuit of the circuit interrupter;
a control circuit which issues a control signal;
an electronic switch enabled by the control signal; and
an electrical load connected to and disconnected to from the load-side circuit via the selective enabling of the electronic switch producing a fault current sufficient to test the instantaneous-trip function subject to the resistance of the load-side resistance.

36. The device of claim 35, wherein the control signal enables the electronic switch to conduct limited to a time no greater than a pre-specified maximum trip time of the instantaneous-trip function.

37. The device of claim 35, wherein the control signal enables the electronic switch to conduct limited to a time no greater than three cycles of AC power.

38. The device of claim 35, wherein the control signal enables the electronic switch to conduct limited to a time no greater about one-half cycle of AC power.

39. The device of claim 35, wherein the electrical load acts as a fuse that opens as a result of failure of the electronic switch to stop conduction.

40. The device of claim 35, wherein the electronic switch includes a silicon-controlled rectifier (SCR), and the control circuit provides an enabling control signal pulse to the SCR at a point in time after a zero-crossing.

41. A method of testing the instantaneous-trip function of a circuit interrupter, the method comprising:
providing a portable testing device that includes an electrical plug having a first external electrical connector and a second external electrical connector adapted to be plugged into a socket wired to a load side of the circuit interrupter, and
receiving a stimulation indication; and
selectively connecting and disconnecting an electrical load to and from the load-side of the circuit interrupter conditional on a receiving of the stimulation indication, wherein the electrical load, when connected, supplies sufficient current to test the instantaneous-trip function of the circuit interrupter.

42. The method of claim 41, wherein the control signal enables the electronic switch to conduct limited to a time no greater than a pre-specified maximum trip time of the instantaneous-trip function.

43. The method of claim 41, wherein the control signal enables the electronic switch to conduct limited to a time no greater than three cycles of AC power.

44. The method of claim 41, wherein the control signal enables the electronic switch to conduct limited to a time no greater about one-half cycle of AC power.

45. The method of claim 41, wherein the electrical load acts as a fuse that opens as a result of failure of the electronic switch to stop conduction.

46. The method of claim 41, wherein the electronic switch includes a silicon-controlled rectifier (SCR), and the control circuit provides an enabling control signal pulse to the SCR at a point in time after a zero-crossing.

47. A tester for testing a circuit interrupter having a line-side, a load-side, a designated instantaneous-tripping current and a designated clearing time, the tester comprising:
a first electrical connector adapted to connect to the load-side circuit's hot conductor of the circuit interrupter;
a second electrical connector adapted to connect to the load-side circuit's neutral conductor of the circuit interrupter;
a control circuit that outputs a control signal for a predetermined time period based on the designated clearing time; and an electronic switch which when enabled by the control signal during the predetermined time period conducts a current proportional to the resistance of the circuit of the load-side of the circuit interrupter plus the resistance of the tester's circuit and which when disabled by the control signal after the time period's end effectively discontinues the current.

48. The tester of claim 47, wherein the control circuit outputs a control signal for a time no greater than the designated clearing time.

49. The tester of claim 47, wherein the control circuit outputs a control signal for a time shorter than the designated clearing time.

50. The tester of claim 47, wherein the tester includes a resistance to limit the current drawn through the load-side circuit of the circuit breaker.

51. The tester of claim 47, wherein the tester includes a resistance which acts as a fuse that opens as a result of failure of the electronic switch to discontinue conduction.

52. The tester of claim 47, wherein a third electrical connector is selectively connected to the load-side circuit of the circuit interrupter.

53. A tester for testing an instantaneous-trip function of a circuit interrupter, the circuit interrupter having a load-side circuit, the tester comprising:
  a first external electrical connector for connecting to the load-side circuit's hot conductor of the circuit interrupter and a second electrical connector for connecting to the load-side circuit's neutral conductor of the circuit interrupter;
  means for initiating, maintaining for a predetermined time, and then terminating a control signal; and
  an electronic switch responsive to the control signal such that, when the switch is conducting, a completed circuit communicating a fault current proportional to the resistance of the circuit is created.

54. The tester of claim 53, wherein the control signal enables the electronic switch to conduct limited to a time no greater than a pre-specified maximum trip time of the instantaneous-trip function.

55. The tester of claim 53, wherein the control circuit outputs a control signal for a time shorter than a pre-specified maximum trip time of the instantaneous-trip function.

56. The tester of claim 53, wherein the tester includes a resistance to limit the fault current of the circuit.

57. The tester of claim 53, wherein the tester includes a resistance which acts as a fuse.

58. The tester of claim 53, wherein the control signal enables the electronic switch to conduct limited to a time no greater than about one-half cycle of AC power.

59. The tester of claim 53, wherein the electronic switch includes a silicon-controlled rectifier (SCR), and the means for initiating the control signal provides an enabling control signal pulse to the SCR at a point in time shortly after a zero-crossing, in order that the SCR is reliably and consistently triggered during each one of a predetermined limited number of half cycles.

60. The tester of claim 59, wherein the control signal enables the electronic switch to conduct a current sufficient to trigger the instantaneous-trip function of the circuit-interrupter, but only during one half cycle of AC power.

61. The tester of claim 59, wherein the control signal enables the electronic switch to conduct a current sufficient to trigger the instantaneous-trip function of the circuit-interrupter, but only during two half cycles of AC power.

62. The tester of claim 59, wherein the control signal enables the electronic switch to conduct a current sufficient to trigger the instantaneous-trip function of the circuit-interrupter, but only during three half cycles of AC power.

63. The tester of claim 59, wherein the control signal enables the electronic switch to conduct a current sufficient to trigger the instantaneous-trip function of the circuit-interrupter, but only during four half cycles of AC power.

64. The tester of claim 59, wherein the control signal enables the electronic switch to conduct a current sufficient to trigger the instantaneous-trip function of the circuit-interrupter, but only during five half cycles of AC power.

65. The tester of claim 59, wherein the control signal enables the electronic switch to conduct a current sufficient to trigger the instantaneous-trip function of the circuit-interrupter, but only during six half cycles of AC power.

66. The tester of claim 53, further comprising a ground fault current generator that provides a ground fault current sufficient to trigger the ground fault trip function of the circuit-interrupter, selectively coupled only during a predetermined limited number of half cycles of AC power.

67. The tester of claim 53, further comprising a overload current generator that provides a overload current sufficient to trigger the overload trip function of the circuit-interrupter, selectively coupled only during a predetermined limited number of half cycles of AC power.

68. The tester of claim 67, wherein the overload current generator provides the overload current, but only during about 100 seconds of AC power.

* * * * *